US008890026B2

(12) United States Patent
Uchiyama et al.

(10) Patent No.: US 8,890,026 B2
(45) Date of Patent: Nov. 18, 2014

(54) METHOD FOR CUTTING PROCESSING TARGET

(75) Inventors: Naoki Uchiyama, Hamamatsu (JP); Daisuke Kawaguchi, Hamamatsu (JP); Hideki Shimoi, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 167 days.

(21) Appl. No.: 13/383,503

(22) PCT Filed: Jul. 21, 2010

(86) PCT No.: PCT/JP2010/062230
§ 371 (c)(1),
(2), (4) Date: Jan. 11, 2012

(87) PCT Pub. No.: WO2011/013549
PCT Pub. Date: Feb. 3, 2011

(65) Prior Publication Data
US 2012/0104066 A1 May 3, 2012

(30) Foreign Application Priority Data
Jul. 28, 2009 (JP) ................... 2009-175835

(51) Int. Cl.
B23K 26/00 (2014.01)
B23K 26/40 (2014.01)
C03B 33/07 (2006.01)
H01L 21/78 (2006.01)
B28D 5/00 (2006.01)
C03B 33/02 (2006.01)

(52) U.S. Cl.
CPC .............. B28D 5/00 (2013.01); B23K 26/4075 (2013.01); B23K 26/0057 (2013.01); C03B 33/07 (2013.01); H01L 21/78 (2013.01); B23K 2201/40 (2013.01); C03B 33/0222 (2013.01)
USPC ................................................ 219/121.69

(58) Field of Classification Search
USPC ......................................... 219/121.69; 225/2
See application file for complete search history.

(56) References Cited

U.S. PATENT DOCUMENTS

| 2004/0002199 A1 | 1/2004 | Fukuyo et al. |
| 2005/0027223 A1 | 2/2005 | Nguyen |

(Continued)

FOREIGN PATENT DOCUMENTS

| CN | 1473087 | 2/2004 |
| CN | 1758985 | 4/2006 |

(Continued)

OTHER PUBLICATIONS

T. Sano et al., "Evaluation of Processing Characteristics of Silicon With Picosecond Pulse Laser—Ultrashort Pulse Laser Microprocessing of Silicon," Preprints of the National Meeting of Japan Welding Society, Apr. 2000, No. 66, pp. 72-73, including partial English translation.

(Continued)

*Primary Examiner* — Dana Ross
*Assistant Examiner* — Renee L Miller
(74) *Attorney, Agent, or Firm* — Drinker Biddle & Reath LLP

(57) ABSTRACT

A rear face 1*b* of an object to be processed 1A and a front face 10*a* of an object to be processed for separation 10A are bonded to each other by anode bonding, whereby a fracture 17 generated in a thickness direction of the object for separation 10A from a molten processed region 13 acting as a start point reaches a front face 1*a* of the object 1A continuously without substantially changing its direction. Then, after cutting the objects 1A, 10A, the object 10A is removed from the object 1A, so as to yield chips 19.

11 Claims, 37 Drawing Sheets

(56) References Cited

U.S. PATENT DOCUMENTS

| | | | |
|---|---|---|---|
| 2005/0202596 A1 | 9/2005 | Fukuyo et al. | |
| 2006/0011593 A1 | 1/2006 | Fukuyo et al. | |
| 2006/0148212 A1 | 7/2006 | Fukuyo et al. | |
| 2006/0255024 A1 | 11/2006 | Fukuyo et al. | |
| 2007/0119892 A1* | 5/2007 | Horsfield | 225/2 |
| 2007/0125757 A1 | 6/2007 | Fukuyo et al. | |
| 2007/0158314 A1 | 7/2007 | Fukumitsu et al. | |
| 2007/0207594 A1* | 9/2007 | Tamura | 438/463 |

FOREIGN PATENT DOCUMENTS

| | | |
|---|---|---|
| CN | 1826207 | 8/2006 |
| CN | 101040369 | 9/2007 |
| CN | 101100018 | 1/2008 |
| CN | 101227999 | 7/2008 |
| CN | 101313387 | 11/2008 |
| CN | 101516565 | 8/2009 |
| JP | 2002118081 A * | 4/2002 |
| JP | 2005-51055 | 2/2005 |
| JP | 2007-118207 | 5/2007 |
| JP | 2008-112813 | 5/2008 |
| JP | 2008-153337 | 7/2008 |
| WO | 03/076120 | 9/2003 |
| WO | 2005/098916 | 10/2005 |
| WO | 2008/146744 | 12/2008 |

OTHER PUBLICATIONS

D. Du et al., "Laser-induced breakdown by impact to ionization in $SiO_2$ with pulse widths from 7 ns to 150 fs," Appl. Phys. Lett. 64 (23), Jun. 6, 1994, pp. 3071-3073.

* cited by examiner

Fig.12
(a)
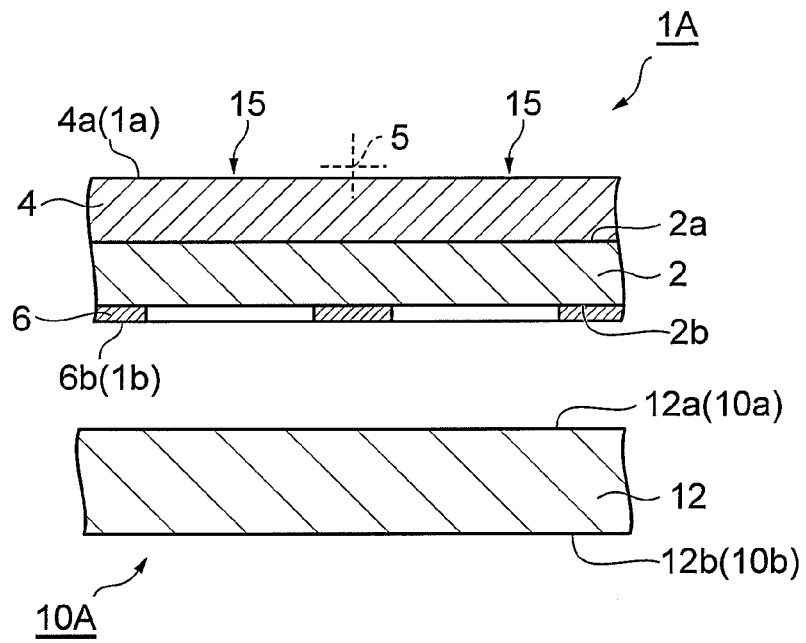
(b)
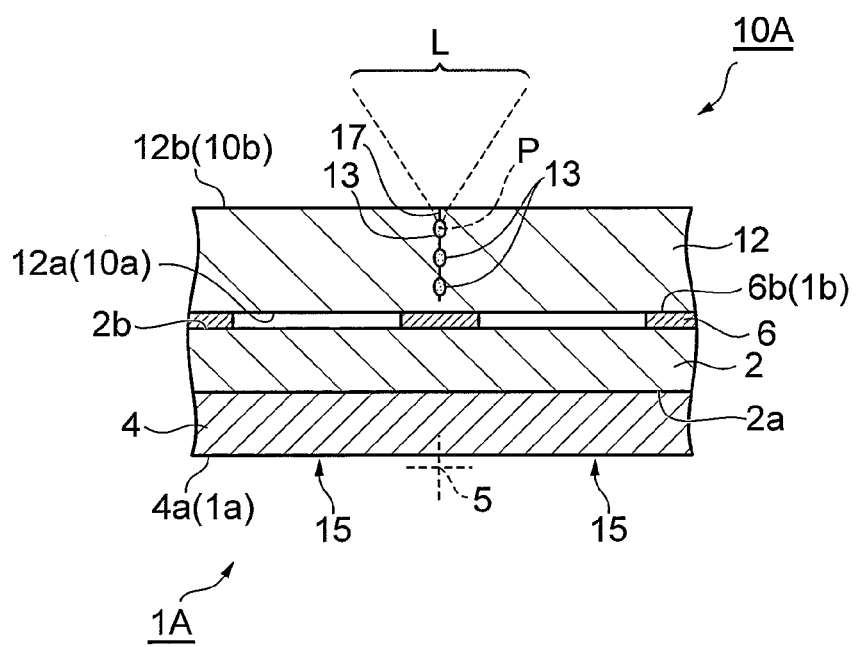

*Fig.13*
(a)
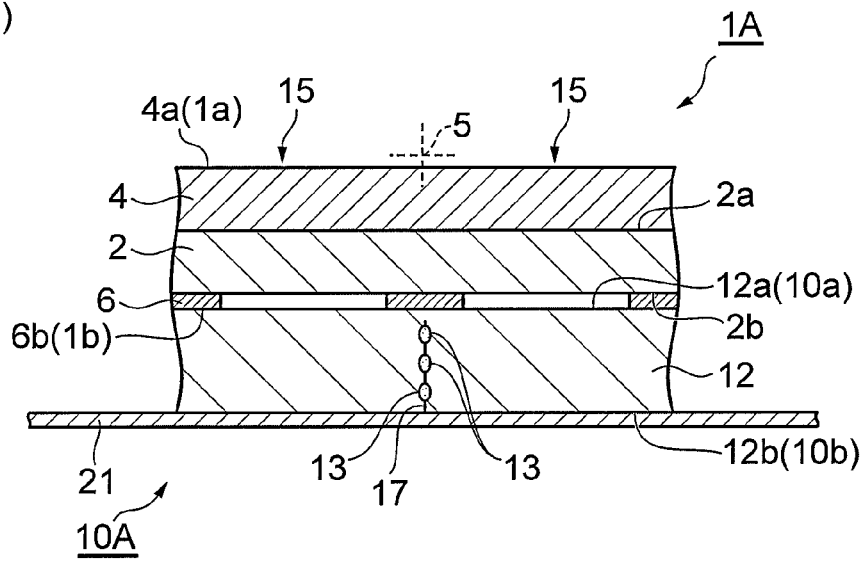
(b)
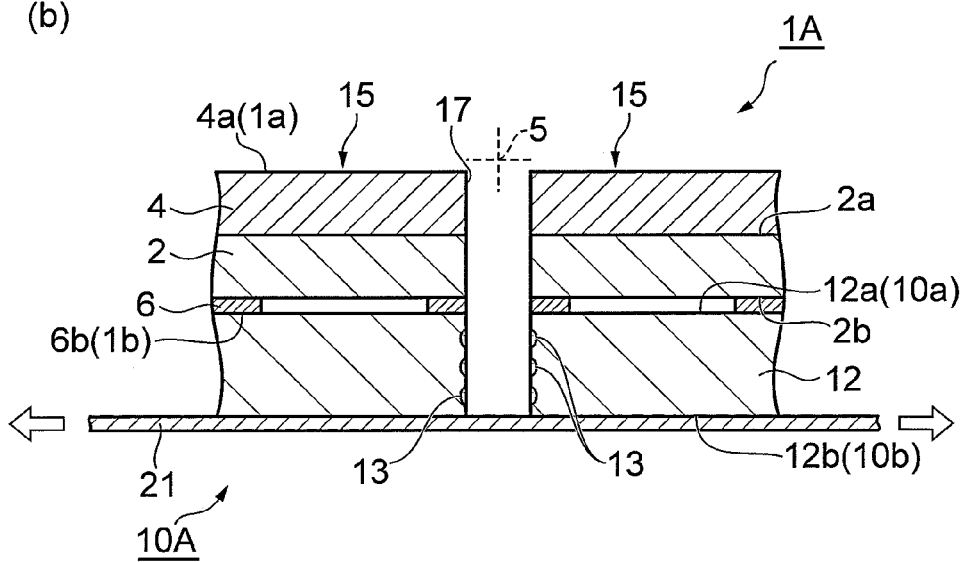

Fig.16
(a)
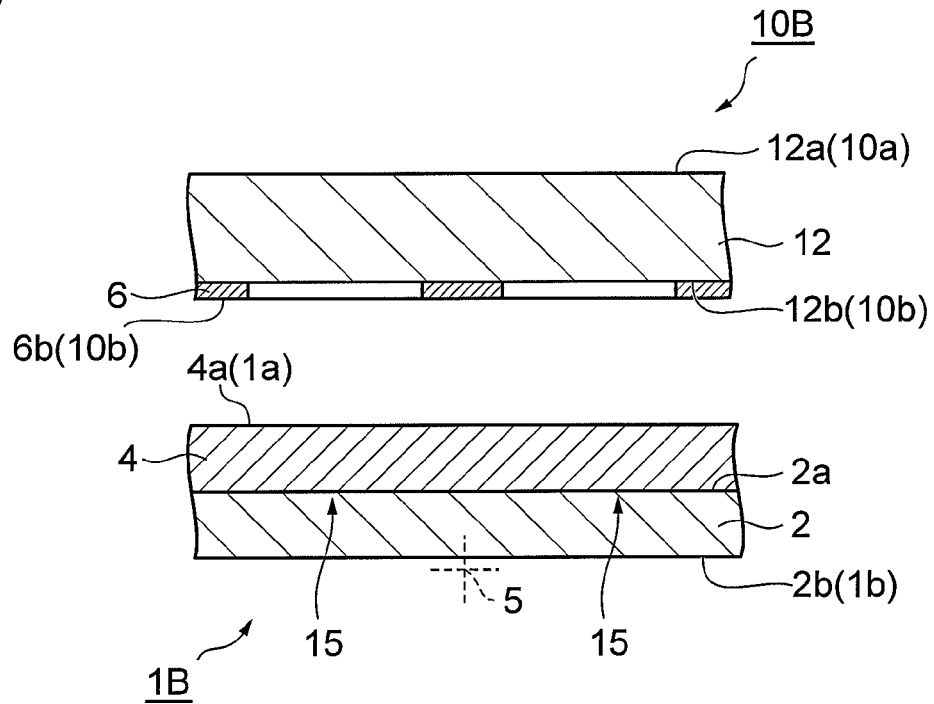
(b)
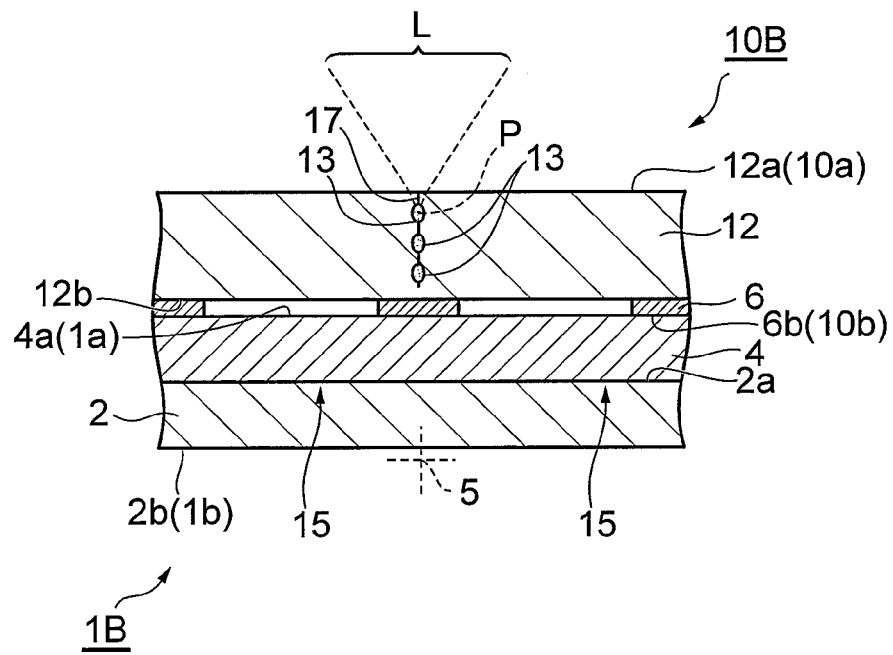

Fig.17
(a)
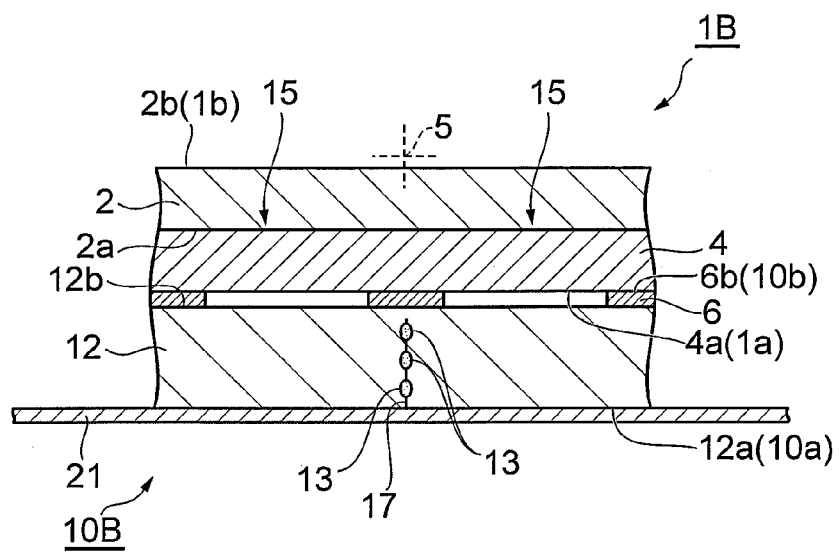
(b)
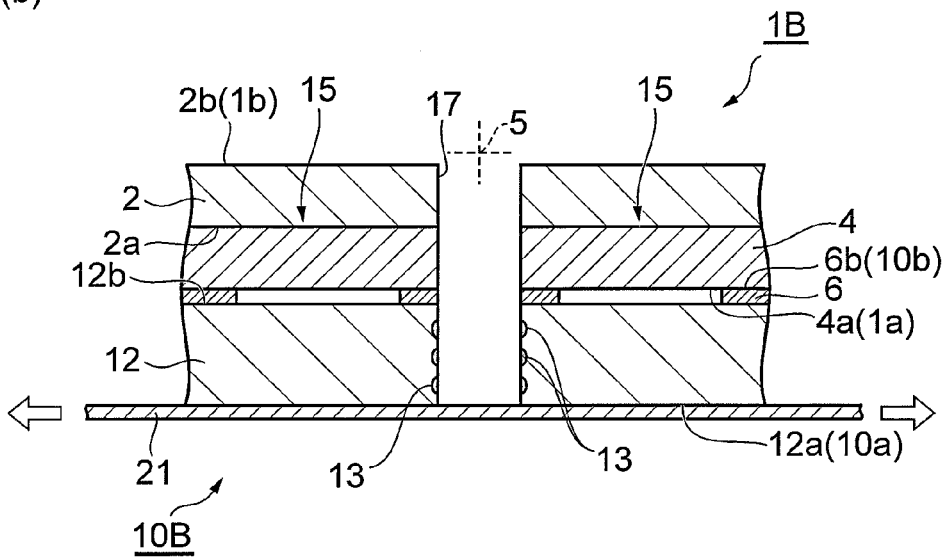

Fig.20
(a)
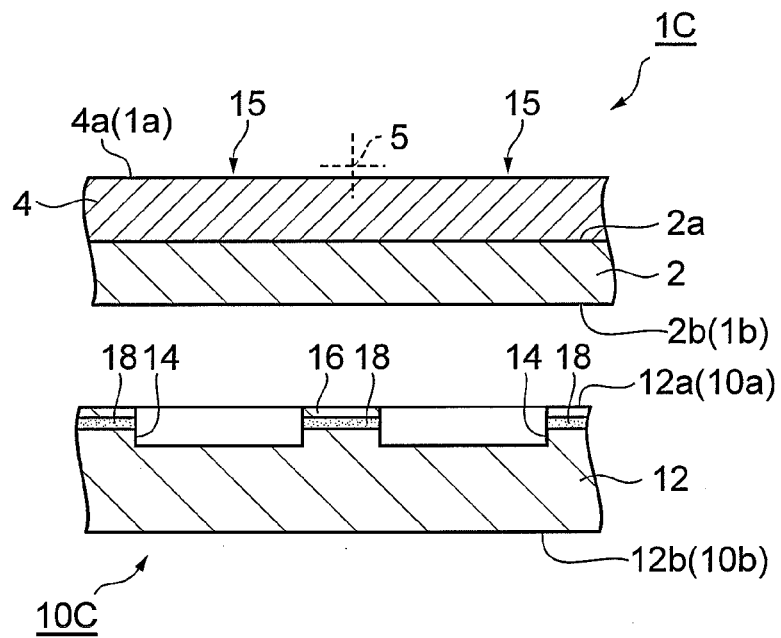
(b)
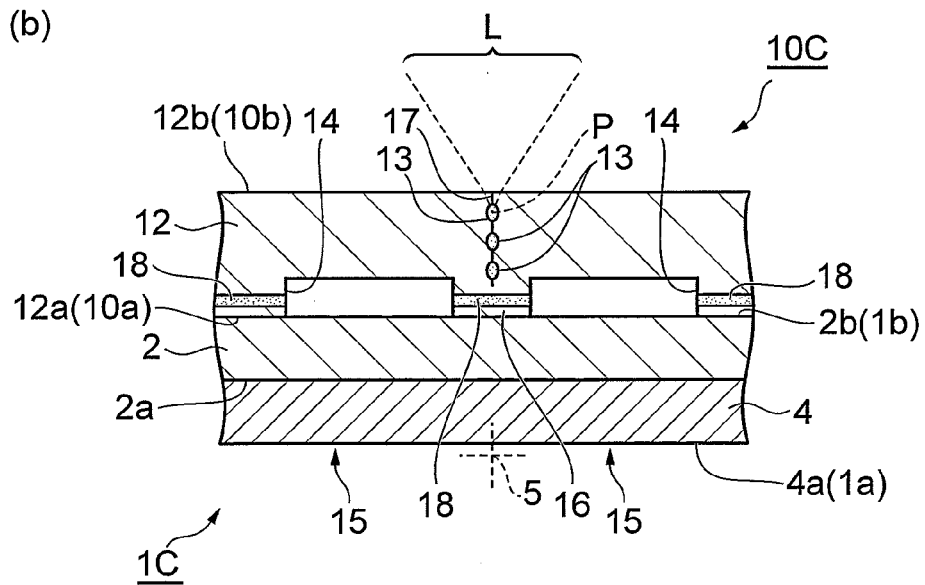

Fig.21
(a)
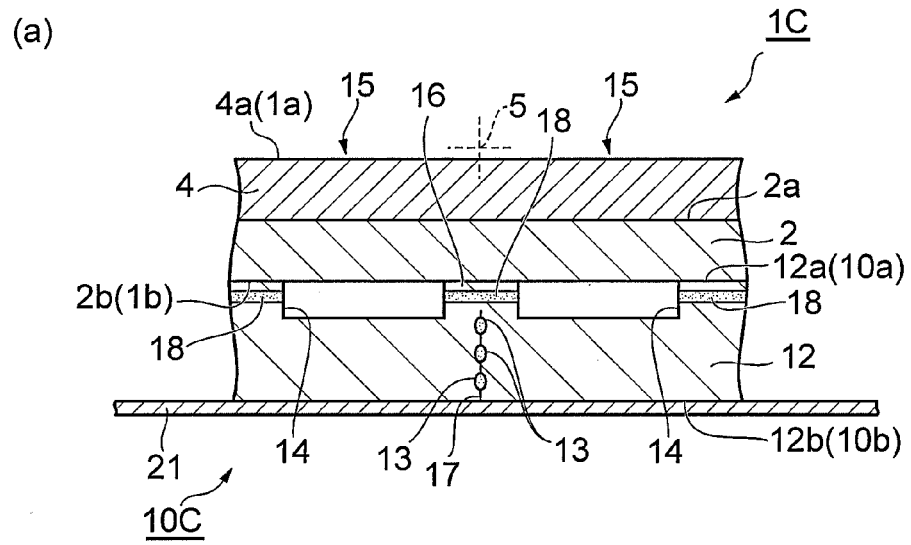
(b)
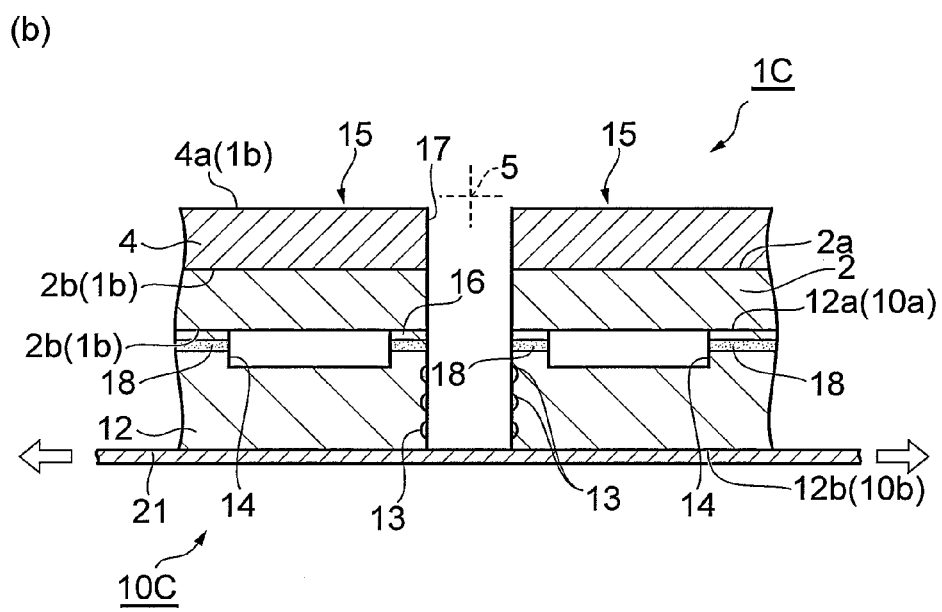

Fig.26
(a)
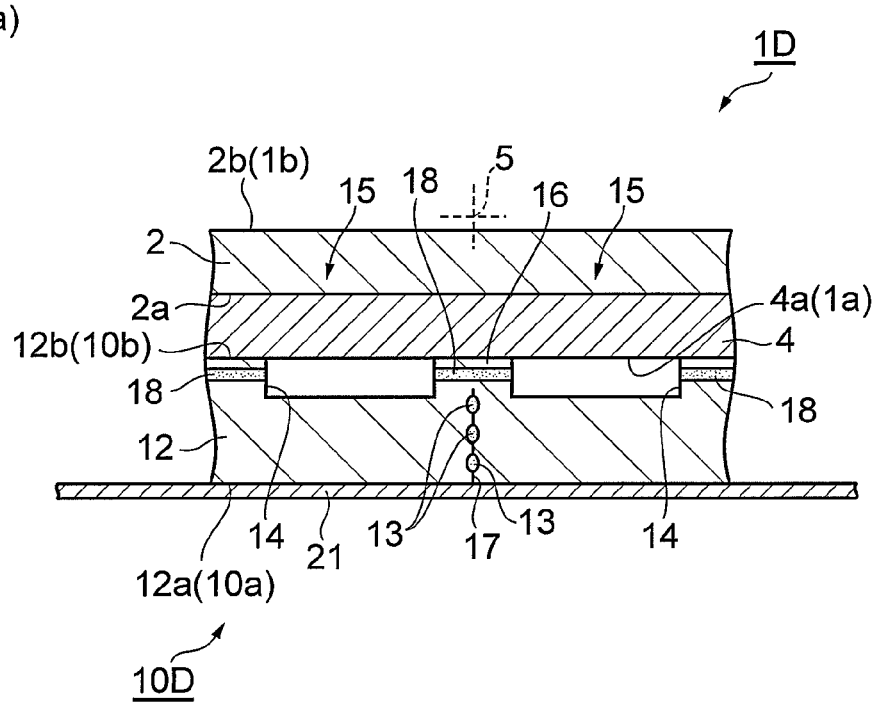
(b)
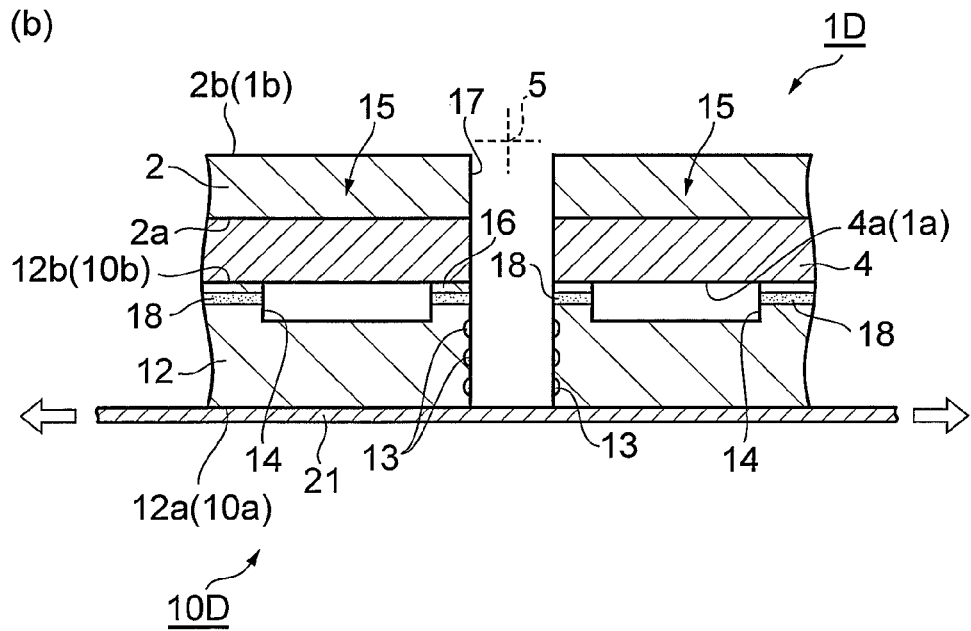

Fig.29
(a)
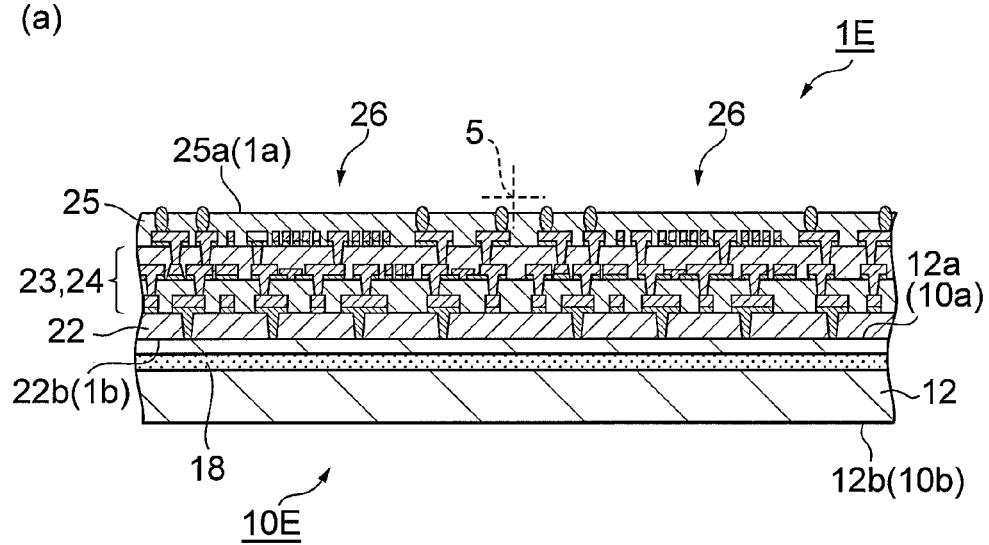
(b)
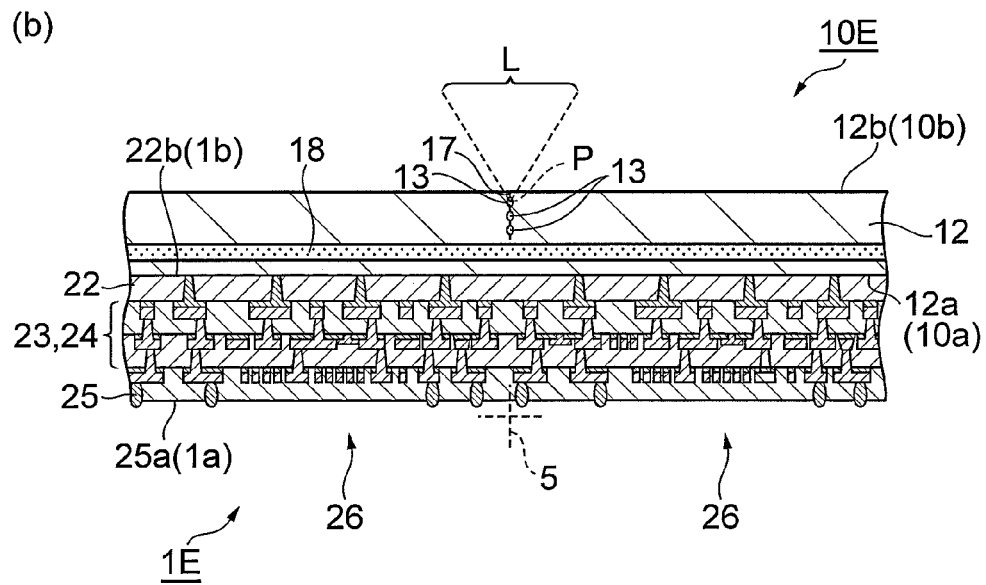

Fig.30
(a)
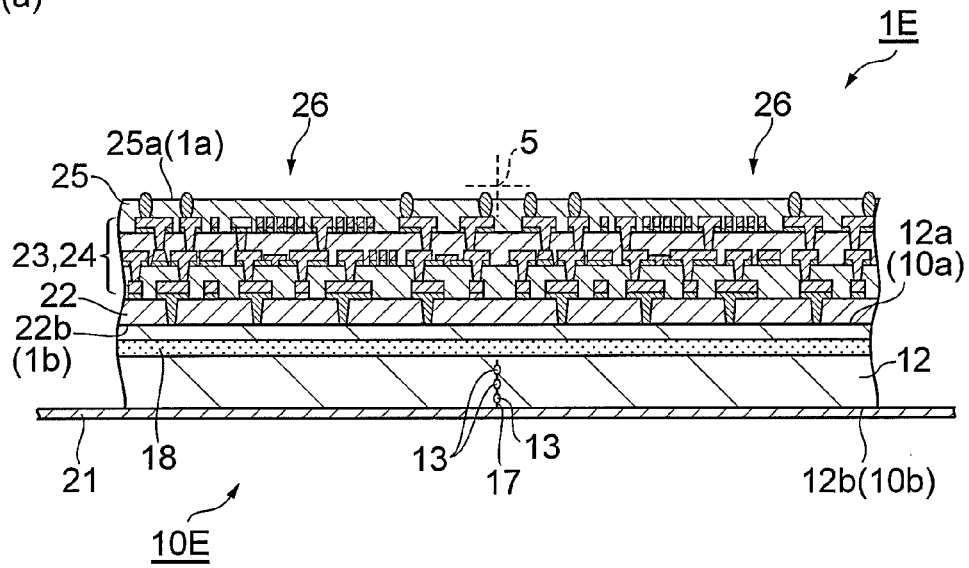
(b)
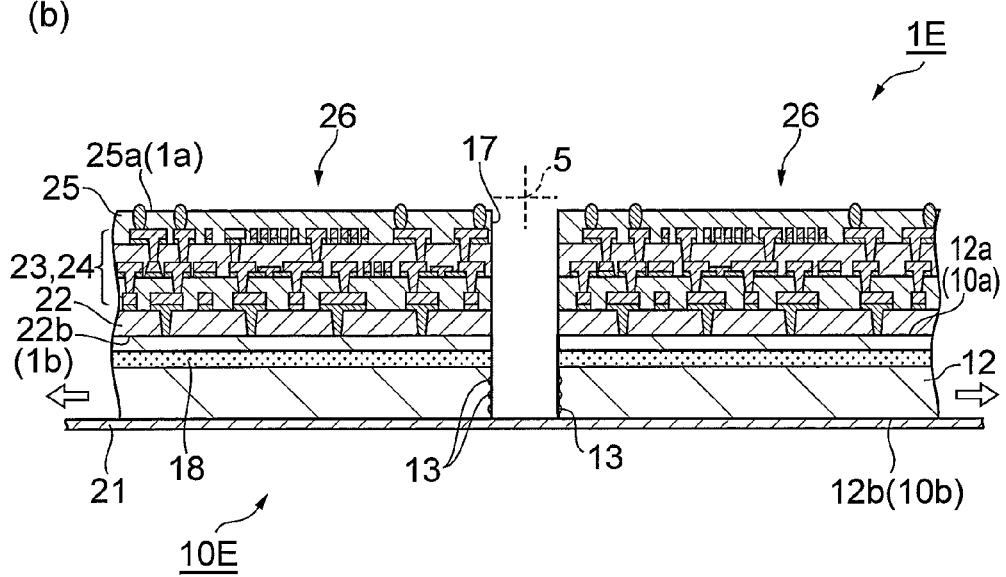

Fig. 33
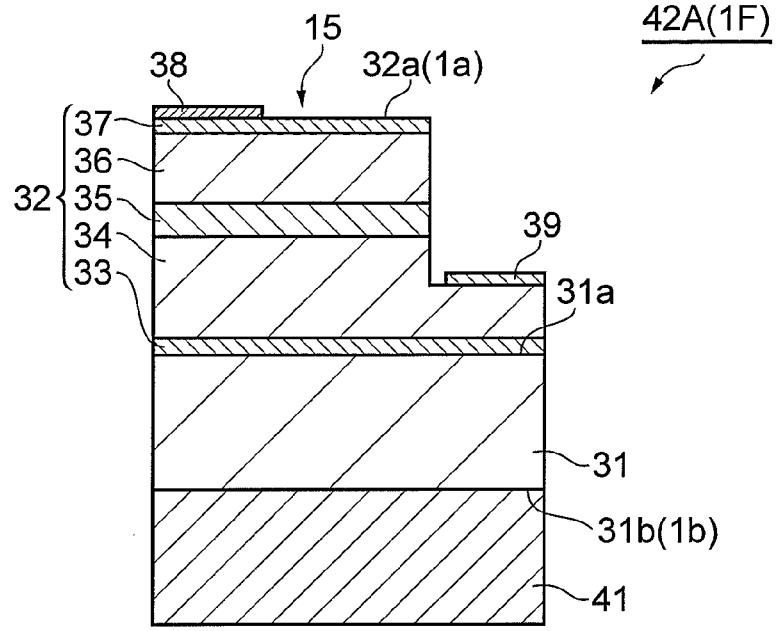
(a)
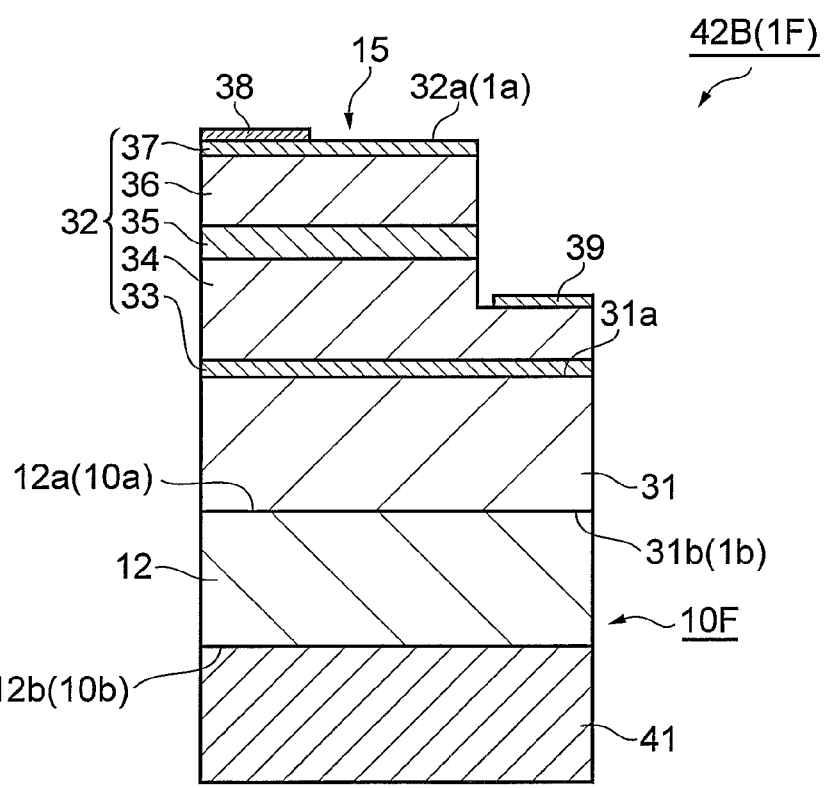
(b)

METHOD FOR CUTTING PROCESSING TARGET

TECHNICAL FIELD

The present invention relates to an object cutting method for cutting a sheet-like object to be processed along a line to cut.

BACKGROUND ART

Known as a conventional object cutting method in the above-mentioned technical field is one irradiating an object to be processed having a substrate and a multilayer unit disposed on the front face of the substrate with laser light, so as to form a modified region at least within the substrate, and cutting the object along a line to cut from the modified region acting as a cutting start point (see, for example, Patent Literature 1).

CITATION LIST

Patent Literature

Patent Literature 1: International Publication No. 03/076120 pamphlet

SUMMARY OF INVENTION

Technical Problem

Object cutting methods such as the one mentioned above may fail to form the modified region to become the cutting start point within the substrate when the substrate is made of LTCC (Low Temperature Co-fired Ceramics) or the like which scatters the laser light and thus makes it hard for the laser light to be guided into the substrate, for example.

It is therefore an object of the present invention to provide an object cutting method which can accurately cut an object to cut along the line to cut without being influenced by the material of the object.

Solution to Problem

For achieving the above-mentioned object, the object cutting method in accordance with the present invention comprises the steps of irradiating, in a state where a first-side end face of a sheet-like first object to be processed and a second-side end face of a sheet-like second object to be processed are bonded to each other, the first object with laser light, so as to form a modified region in the first object along a line to cut for cutting the second object into a plurality of chips; generating a stress in the first object so as to cause a fracture generated from the modified region acting as a start point to reach a second-side end face of the first object and a first-side end face of the second object and cut the second object along the line; and removing cut pieces of the first object from cut pieces of the second object, so as to yield the chips.

In this object cutting method, since the second-side end face of the second object is bonded to the first-side end face of the first object, the fracture generated in the thickness direction of the first object from the modified region acting as a start point is transmitted to the second object without substantially changing its direction, thereby reaching the first-side end face of the second object. After the first and second objects are cut, the first object is removed from the second object, whereby chips are obtained. Therefore, forming the modified region in the first object along the line to cut for cutting the second object into a plurality of chips can accurately cut the second object along the line without forming any cutting start point in the second object.

Preferably, the first-side end face of the first object and the second-side end face of the second object are bonded to each other by anode bonding. Preferably, the first-side end face of the first object and the second-side end face of the second object are bonded to each other by surface-activated direct bonding. These bonding methods directly bond the first-side end face of the first object and the second-side end face of the second object firmly to each other. Therefore, the fracture grown in the first object in its thickness direction can reliably be extended into the second object continuously without substantially changing its direction through an interface between the first-side end face of the first object and the second-side end face of the second object.

Preferably, the first object is irradiated with the laser light while using the second-side end face of the first object as a laser light entrance surface. In this case, the molten processed region can reliably be formed within the silicon substrate of the first object regardless of whether the second object to cut is easy or hard to guide the laser light therein.

Preferably, the stress is generated in the first object by expanding an expandable holding member attached to the second-side end face of the first object. In this case, simply expanding the holding member attached to the second-side end face of the first object can easily extend the fracture generated in the first object from the modified region acting as a start point toward the second object.

Preferably, the cut pieces of the first object are removed from the cut pieces of the second object by etching. In this case, the first object can efficiently be removed from the second object in order to yield the chips after cutting the first and second objects.

Preferably, in this case, a modified region for separation is formed in the first object, and the etching is performed by using an etchant exhibiting a higher etching rate for the modified region for separation than for an unmodified region in the first object. This can efficiently remove the first object from the second object.

Preferably, the second object has a plurality of functional devices, while the line to cut is set such as to pass between the functional devices adjacent to each other. In this case, chips having the functional devices can be obtained with a favorable yield.

There are respective cases where the second object comprises a glass substrate, an LTCC substrate, and a sapphire substrate. In these cases, the second object can be cut accurately along the line to cut without forming any cutting start point in the glass substrate, LTCC substrate, and sapphire substrate.

Advantageous Effects of Invention

The present invention can accurately cut the object to cut along the line to cut without being influenced by the material of the object. Since the object is cut by a fissure (fracture) alone without being processed directly, the quality of its cut sections is very high (fine), while its resulting chips have a very high bending strength.

BRIEF DESCRIPTION OF DRAWINGS

FIG. 12 is a partial sectional view of the object for explaining the object cutting method in accordance with the first embodiment;

FIG. 13 is a partial sectional view of the object for explaining the object cutting method in accordance with the first embodiment;

FIG. 16 is a partial sectional view of the object for explaining the object cutting method in accordance with the second embodiment;

FIG. 17 is a partial sectional view of the object for explaining the object cutting method in accordance with the second embodiment;

FIG. 20 is a partial sectional view of the object for explaining the object cutting method in accordance with the third embodiment;

FIG. 21 is a partial sectional view of the object for explaining the object cutting method in accordance with the third embodiment;

FIG. 26 is a partial sectional view of the object for explaining the object cutting method in accordance with the fourth embodiment;

FIG. 29 is a partial sectional view of the object for explaining the object cutting method in accordance with the fifth embodiment;

FIG. 30 is a partial sectional view of the object for explaining the object cutting method in accordance with the fifth embodiment;

FIG. 33 is a sectional view of the object cut by the object cutting method in accordance with the sixth embodiment;

DESCRIPTION OF EMBODIMENTS

Figure 1:
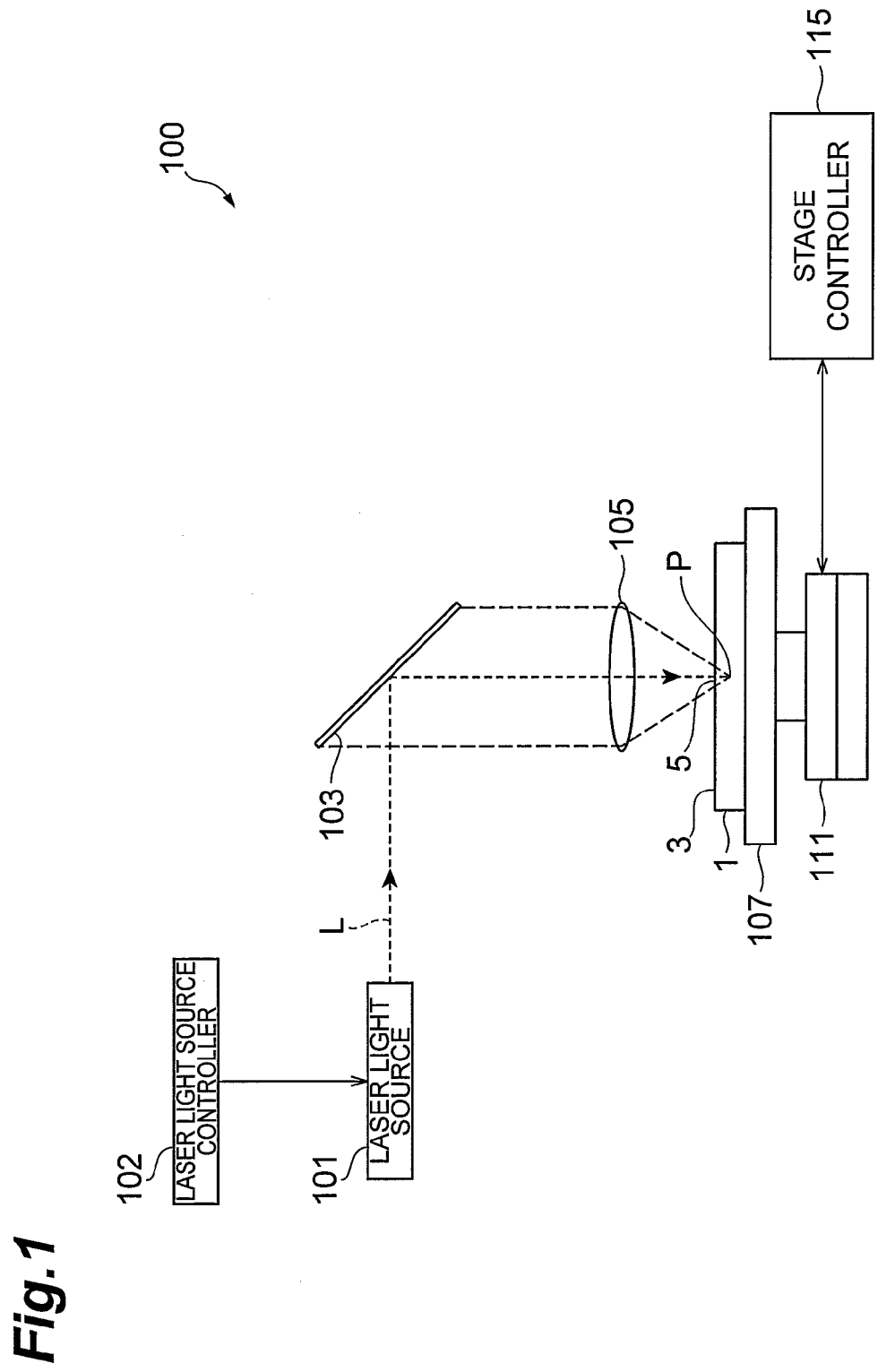
FIG. 1 is a schematic structural diagram of a laser processing apparatus used for forming a modified region.

In the following, preferred embodiments of the present invention will be explained in detail with reference to the drawings. In the drawings, the same or equivalent parts will be referred to with the same signs while omitting their overlapping descriptions.

The object cutting method in accordance with an embodiment irradiates a sheet-like object to be processed with laser light while locating a converging point at the object, so as to form a modified region in the object along a line to cut. Therefore, the forming of the modified region in the object cutting method in accordance with this embodiment will firstly be explained with reference to FIGS. 1 to 9.

As illustrated in FIG. 1, a laser processing apparatus 100 comprises a laser light source 101 for causing laser light (processing laser light) L to oscillate in a pulsating manner, a dichroic mirror 103 arranged such as to change the direction of the optical axis of the laser light L by 90°, and a condenser lens 105 for converging the laser light L. The laser processing apparatus 100 further comprises a support table 107 for supporting an object to be processed 1 which is irradiated with the laser light L converged by the condenser lens 105, a stage 111 for moving the support table 107 along X, Y, and Z axes, a laser light source controller 102 for regulating the laser light source 101 in order to adjust the output, pulse width, and the like of the laser light L, and a stage controller 115 for regulating movements of the stage 111.

In the laser processing apparatus 100, the laser light L emitted from the laser light source 101 changes the direction of its optical axis by 90° with the dichroic mirror 103 and then is converged by the condenser lens 105 into the object 1 mounted on the support table 107. At the same time, the stage 111 is shifted, so that the object 1 moves relative to the laser light L along a line to cut 5. This forms a modified region to become a cutting start point in the object 1 along the line 5. In the following, the modified region will be explained in detail.

Figure 2:
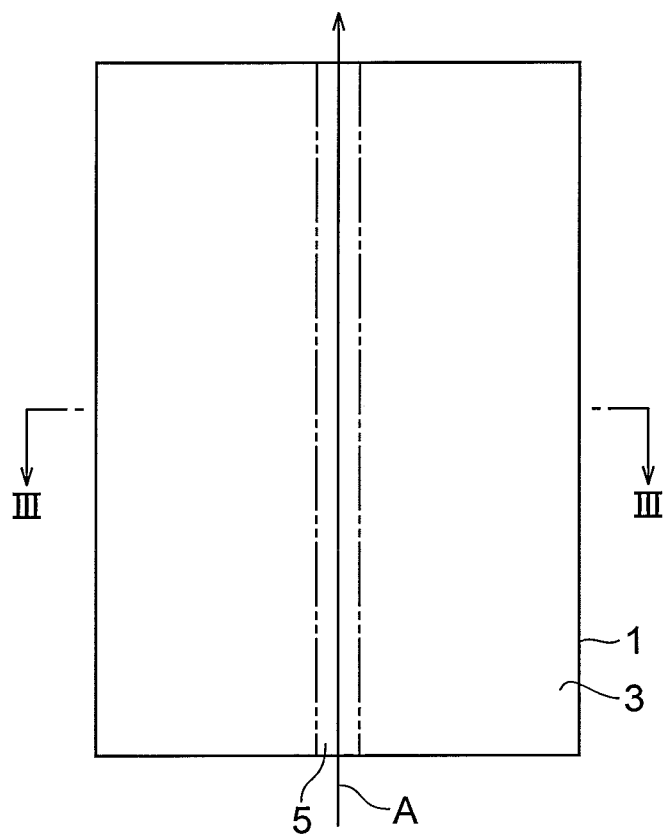
FIG. 2 is a plan view of an object to be processed for which the modified region is formed.
Figure 3:
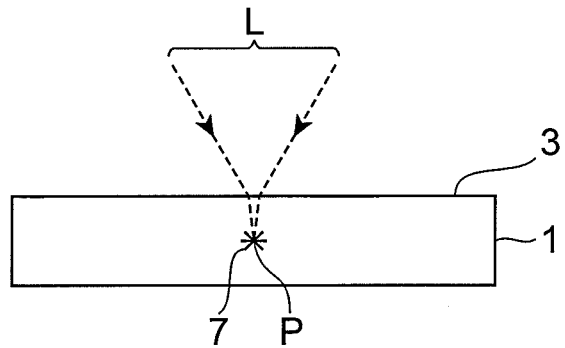
FIG. 3 is a sectional view of the object taken along the line III-III of FIG. 2.
Figure 4:
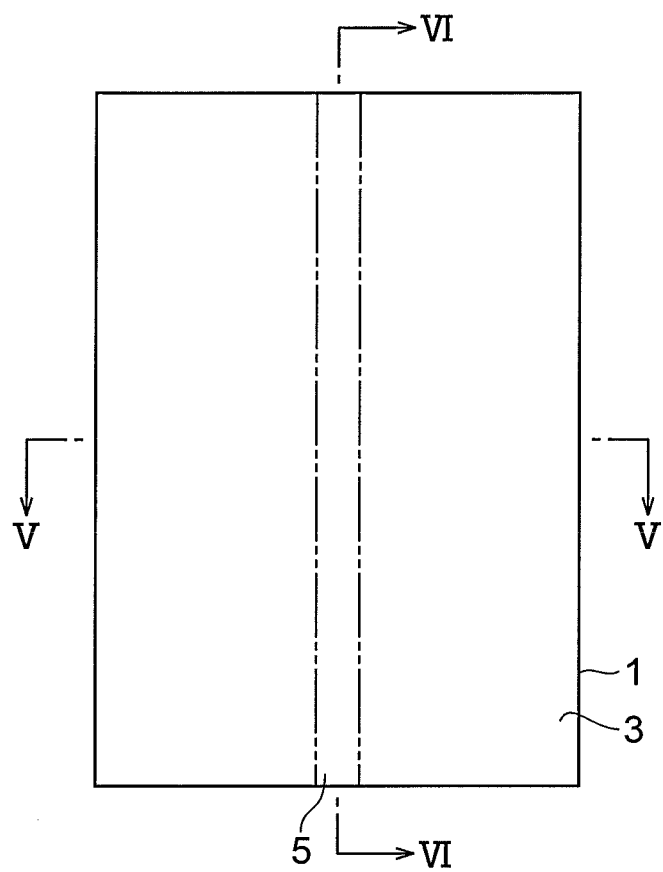
FIG. 4 is a plan view of the object after laser processing.
Figure 5:
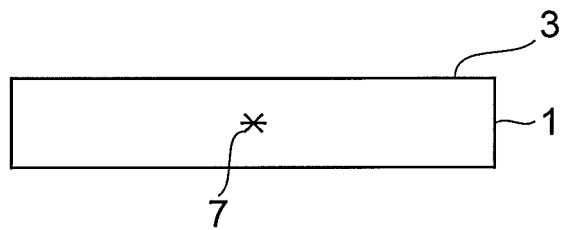
FIG. 5 is a sectional view of the object taken along the line V-V of FIG. 4.
Figure 6:
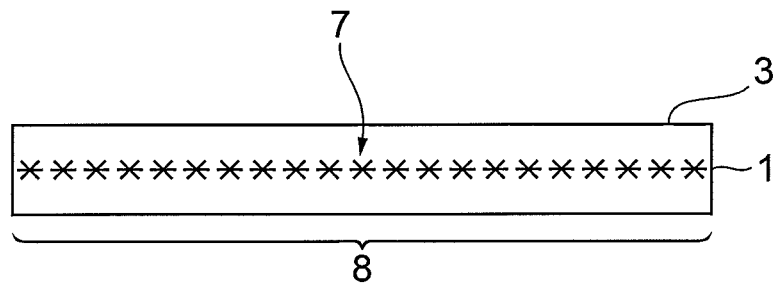
FIG. 6 is a sectional view of the object taken along the line VI-VI of FIG. 4.

As illustrated in FIG. 2, the line 5 is set in the object 1 shaped like a sheet. The line 5 is a virtual line extending straight. When forming a modified region within the object 1, the laser light L is relatively moved along the line 5 (i.e., in the direction of arrow A in FIG. 2) while locating a converging point P within the object 1 as illustrated in FIG. 3. This forms a modified region 7 within the object 1 along the line 5 as illustrated in FIGS. 4 to 6, whereby the modified region 7 formed along the line 5 becomes a cutting start region 8.

The converging point P is a position at which the laser light L is converged. The line 5 may be curved instead of being straight, and may be a line actually drawn on the front face 3 of the object 1 without being restricted to the virtual line. The modified region 7 may be formed either continuously or intermittently. It will be sufficient if the modified region 7 is formed at least within the object 1. There are cases where fractures are formed from the modified region 7 acting as a start point, and the fractures and modified region 7 may be exposed at outer surfaces (the front face, rear face, and outer peripheral face) of the object 1.

Here, the laser light L is absorbed in particular in the vicinity of the converging point within the object 1 while being transmitted therethrough, whereby the modified region 7 is formed in the object 1 (internal absorption type laser processing). Therefore, the front face 3 of the object 1 hardly absorbs the laser light L and thus does not melt. In the case of forming a removing part such as a hole or groove by melting it away from the front face 3, the processing region gradually progresses from the front face 3 side to the rear face side in general (surface absorption type laser processing).

By the modified region formed in this embodiment are meant regions whose physical characteristics such as density, refractive index, and mechanical strength have attained states different from those of their surroundings. Examples of the modified region include (1) molten processed regions, (2) crack regions or dielectric breakdown regions, (3) refractive index changed regions, and their mixed regions.

The modified region in this embodiment is formed by local absorption of laser light or a phenomenon known as multiphoton absorption. A material becomes transparent when its absorption bandgap $E_G$ is greater than photon energy hv, so that a condition under which absorption occurs in the material is $h\nu > E_G$. However, even when optically transparent, the material generates absorption under a condition of $nh\nu > E_G$ (where n=2, 3, 4, . . . ) if the intensity of laser light L becomes very high. This phenomenon is known as multiphoton absorption. The forming of a molten processed region by multiphoton absorption is disclosed, for example, in "Silicon Processing Characteristic Evaluation by Picosecond Pulse Laser", Preprints of the National Meetings of Japan Welding Society, Vol. 66 (April, 2000), pp. 72-73.

Also, modified regions formed by employing ultrashort-pulsed laser light having a pulse width of several picoseconds to femtoseconds may be utilized as described in D. Du, X. Liu, G. Korn, J. Squier, and G. Mourou, "Laser Induced Breakdown by Impact Ionization in $SiO_2$ with Pulse Widths from 7 ns to 150 fs", Appl. Phys. Lett. 64(23), Jun. 6, 1994.

(1) Case where the Modified Region Includes a Molten Processed Region

An object to be processed (e.g., semiconductor material such as silicon) is irradiated with the laser light L while locating a converging point within the object under a condition with a field intensity of at least $1 \times 10^8$ (W/cm$^2$) at the converging point and a pulse width of 1 μs or less. As a consequence, the laser light L is absorbed in the vicinity of the converging point, so that the inside of the object is locally heated, and this heating forms a molten processed region within the object.

The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure changes to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the object is of a silicon monocrystal structure, the molten processed region is an amorphous silicon structure, for example.

Figure 7:
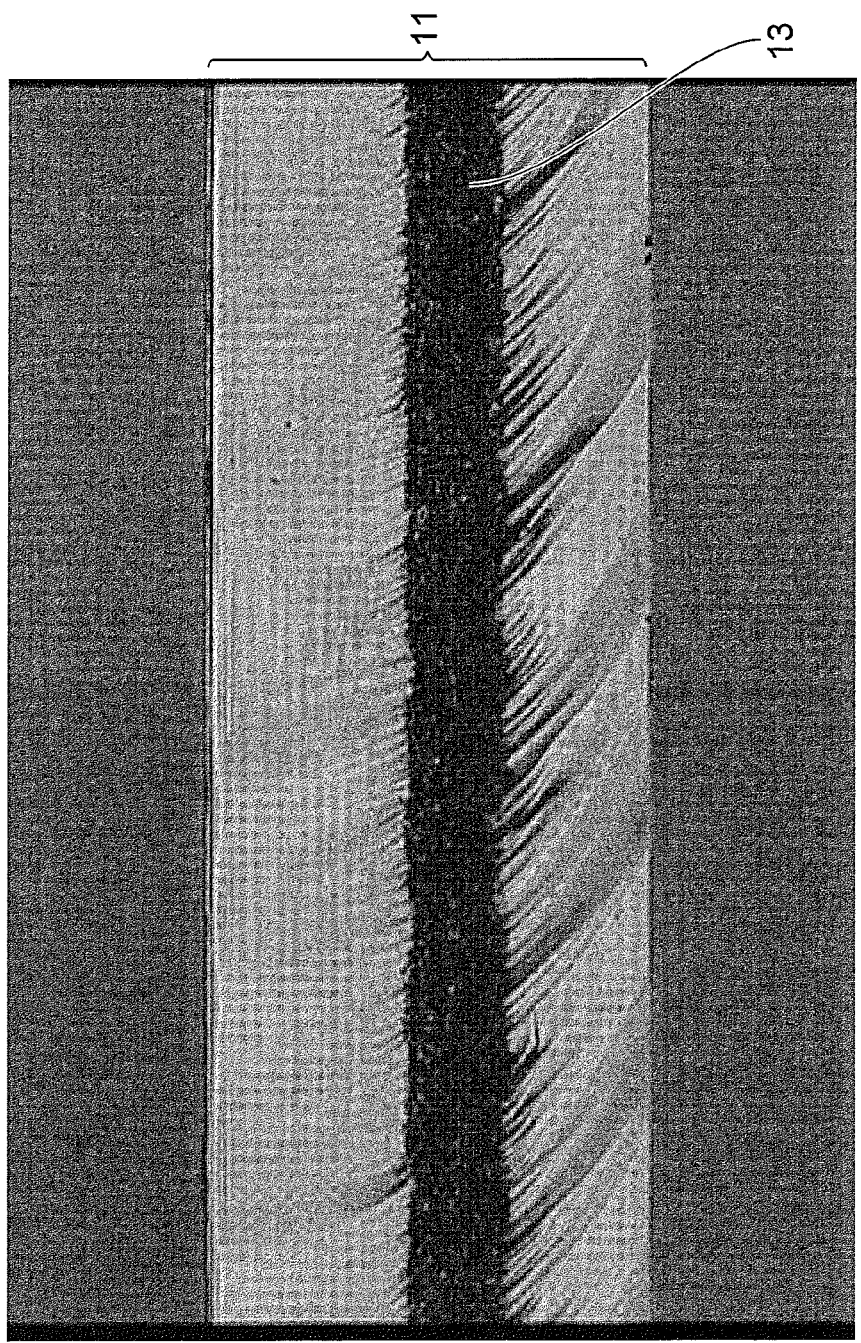
FIG. 7 is a view illustrating a photograph of a cut section of a silicon wafer after laser processing.

FIG. 7 is a view illustrating a photograph of a cross section in a part of a silicon wafer (semiconductor substrate) irradiated with laser light. As illustrated in FIG. 7, a molten processed region 13 is formed within a semiconductor substrate 11.

Figure 8:
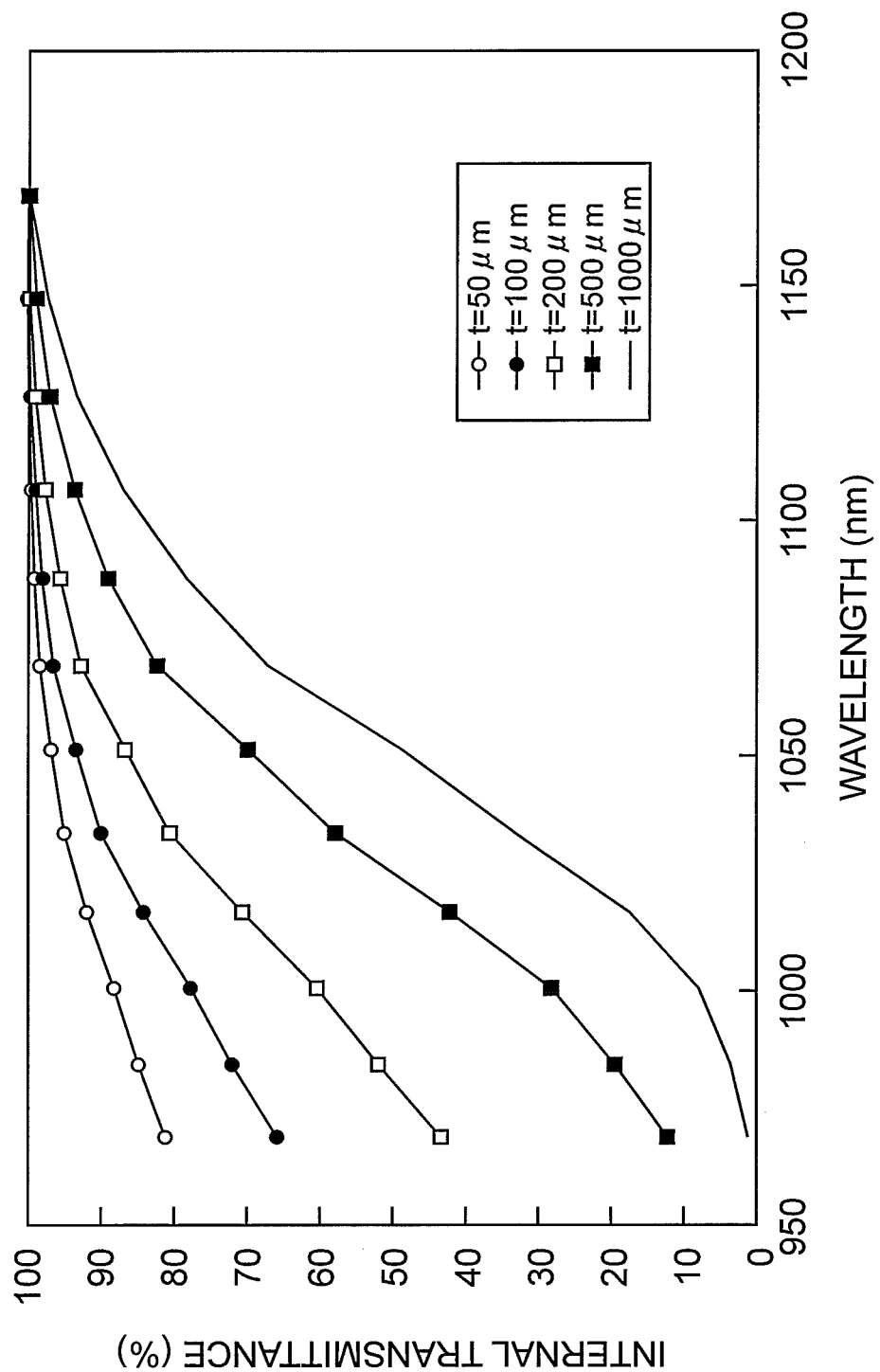
FIG. 8 is a graph illustrating relationships between the peak power density of laser light and crack spot size.

The fact that the molten processed region 13 is formed within a material transparent to the wavelength of the laser light incident thereon will now be explained. FIG. 8 is a graph illustrating relationships between the laser light wavelength and the transmittance within the silicon substrate. Here, the respective reflected components on the front and rear face sides of the silicon substrate are eliminated, so as to indicate the internal transmittance alone. The respective relationships are represented in the cases where the thickness t of the silicon substrate is 50 μm, 100 μm, 200 μm, 500 μm, and 1000 μm.

For example, at the Nd:YAG laser wavelength of 1064 nm, the laser light L appears to be transmitted through the silicon substrate by at least 80% when the silicon substrate has a thickness of 500 μm or less. Since the semiconductor substrate 11 represented in FIG. 7 has a thickness of 350 μm, the molten processed region 13 is formed near the center of the semiconductor substrate 11, i.e., at a part distanced from the front face by 175 μm. The transmittance in this case is 90% or more with reference to a silicon wafer having a thickness of 200 μm, whereby the laser light L is absorbed only slightly within the semiconductor substrate 11 but is substantially transmitted therethrough. When converged within the silicon wafer under the condition of at least $1 \times 10^8$ (W/cm$^2$) with a pulse width of 1 μs or less, however, the laser light L is locally absorbed at the converging point and its vicinity, whereby the molten processed region 13 is formed within the semiconductor substrate 11.

There is a case where fractures occur in the silicon wafer from the molten processed region acting as a start point. There is also a case where fractures are formed as being incorporated in the molten processed region. In the latter case, the fractures may be formed over the whole surface of the molten processed region or in only a part or a plurality of parts thereof. These fractures may grow naturally or as a force is exerted on the silicon wafer. The fractures naturally growing from the molten processed region include both of cases where they grow from a state in which the molten processed region is molten and where they grow when the molten processed region is re-solidified from the molten state. In either case, the molten processed region is formed only within the silicon wafer and, when at a cut section, within the cut section as illustrated in FIG. 7.

(2) Case where the Modified Region Includes a Crack Region

An object (e.g., glass or a piezoelectric material made of LiTaO$_3$) is irradiated with the laser light L while locating a converging point therewithin under a condition with a field intensity of at least $1 \times 10^8$ (W/cm$^2$) at the converging point and a pulse width of 1 µs or less. This magnitude of pulse width is a condition under which the laser light L is absorbed within the object so that a crack region is formed therein. This generates a phenomenon of optical damage within the object. This optical damage induces a thermal distortion within the object, thereby forming a crack region including a crack or a plurality of cracks within the object. The crack region may also be referred to as a dielectric breakdown region.

Figure 9:
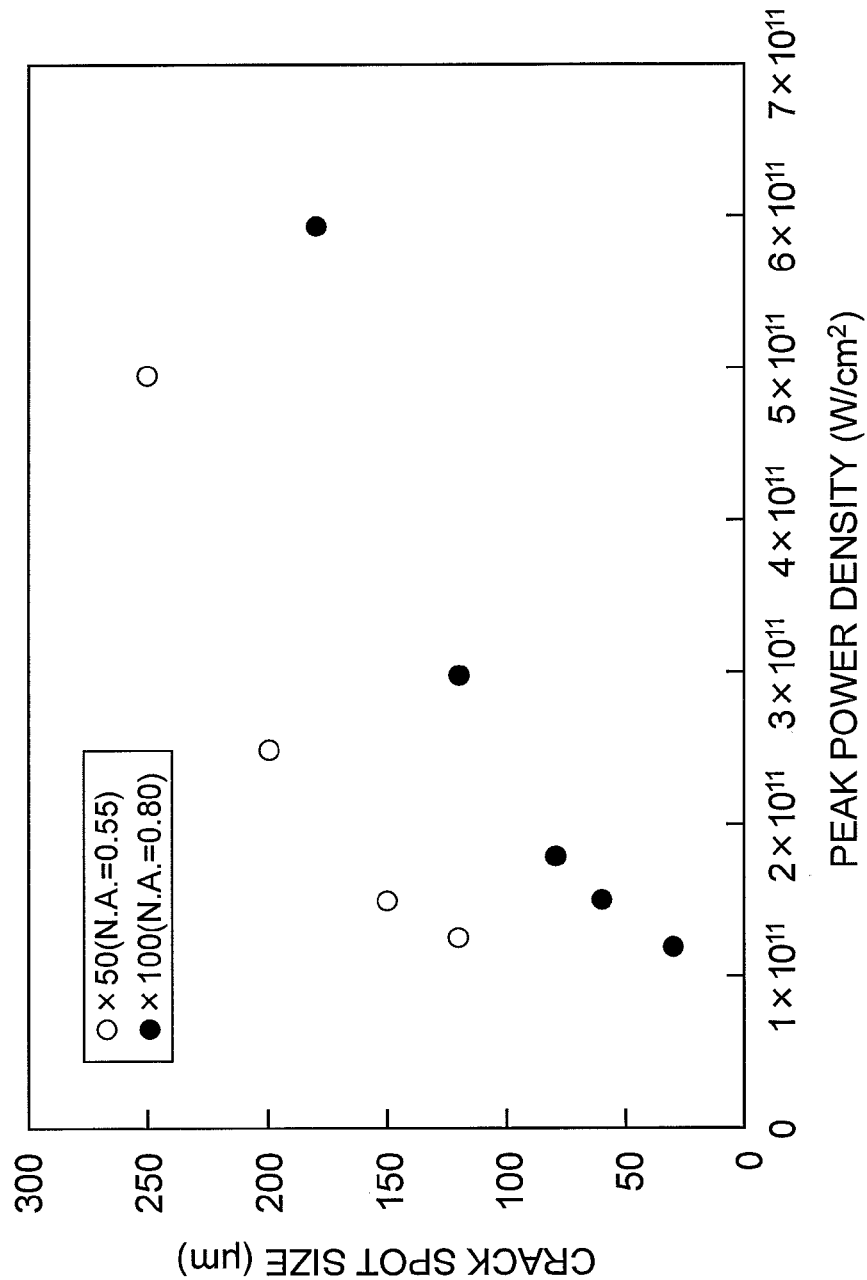
FIG. 9 is a graph illustrating relationships between the peak power density of laser light and crack spot size.

FIG. 9 is a graph illustrating results of experiments concerning relationships between the field intensity and crack size. The abscissa indicates the peak power density. Since the laser light L is pulsed laser light, the field intensity is represented by the peak power density. The ordinate indicates the size of a crack part (crack spot) formed within the object by one pulse of the laser light L. Crack spots gather to yield a crack region. The crack spot size is the size of a part yielding the maximum length among forms of crack spots. Data represented by black circles in the graph represent a case where the condenser lens (C) has a magnification of ×100 and a numerical aperture (NA) of 0.80. On the other hand, data represented by whitened circles in the graph represent a case where the condenser lens (C) has a magnification of ×50 and a numerical aperture (NA) of 0.55. Crack spots are seen to occur within the object from when the peak power density is about $10^{11}$ (W/cm$^2$) and become greater as the peak power density increases.

(3) Case where the Modified Region Includes a Refractive Index Changed Region

An object to be processed (e.g., glass) is irradiated with the laser light L while locating a converging point within the object under a condition with a field intensity of at least $1 \times 10^8$ (W/cm$^2$) at the converging point and a pulse width of 1 ns or less. When the laser light L is thus absorbed within the object while having a very short pulse width, its energy is not converted into thermal energy, whereby an eternal structure change such as ion valence change, crystallization, or orientation polarization is induced within the object, thus forming a refractive index changed region.

The modified region, which encompasses the molten processed regions, dielectric breakdown regions, refractive index changed regions, and their mixed regions, may be an area where the density of the modified region has changed from that of an unmodified region in the material or an area formed with a lattice defect. They can collectively be referred to as a high-density transitional region.

The molten processed regions, refractive index changed regions, areas where the modified region has a density different from that of the unmodified region, or areas formed with a lattice defect may further incorporate a fracture (fissure or microcrack) therewithin or at an interface between the modified and unmodified regions. The incorporated fracture may be formed over the whole surface of the modified region or in only a part or a plurality of parts thereof.

The object can be cut precisely if the modified region is formed as follows while taking account of the crystal structure of the object, its cleavage characteristic, and the like.

When the substrate is formed with an orientation flat in a direction to be formed with the above-mentioned modified region (e.g., a direction extending along a (111) plane in a monocrystal silicon substrate) or a direction orthogonal to the direction to be formed therewith, the modified region can be formed easily and accurately in the substrate with reference to the orientation flat.

The object cutting methods in accordance with embodiments will now be explained.

First Embodiment

Figure 10:
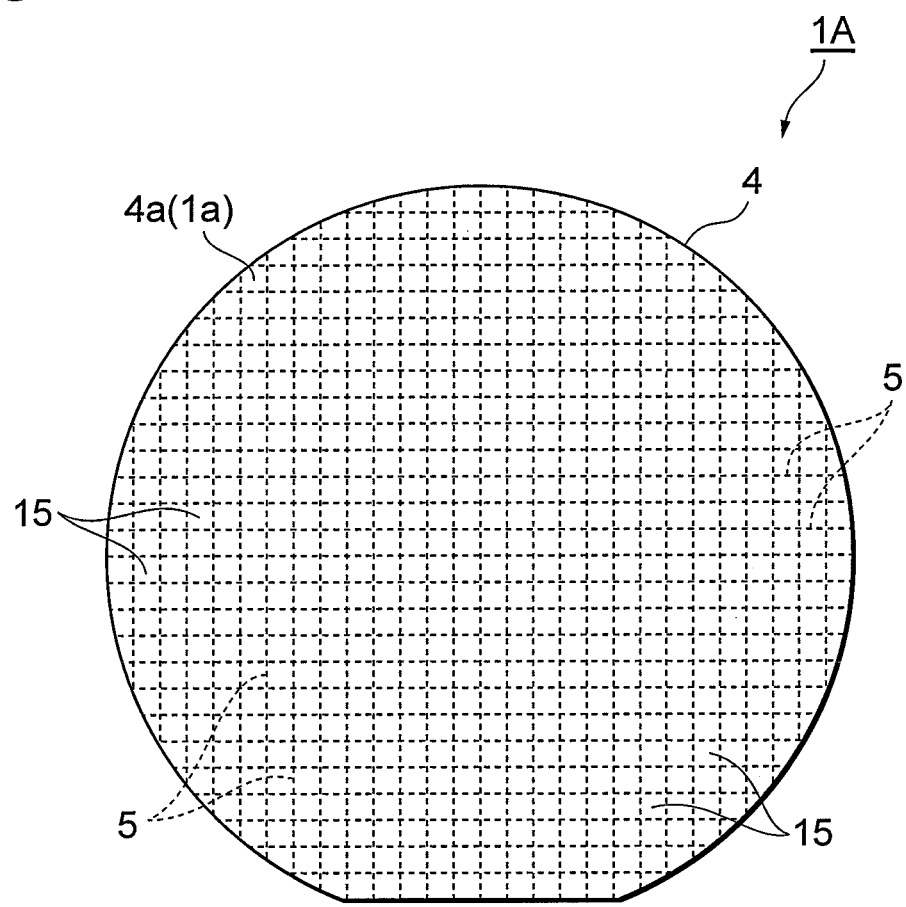
FIG. 10 is a plan view of an object to be processed to which the object cutting method in accordance with a first embodiment is applied.
Figure 11:
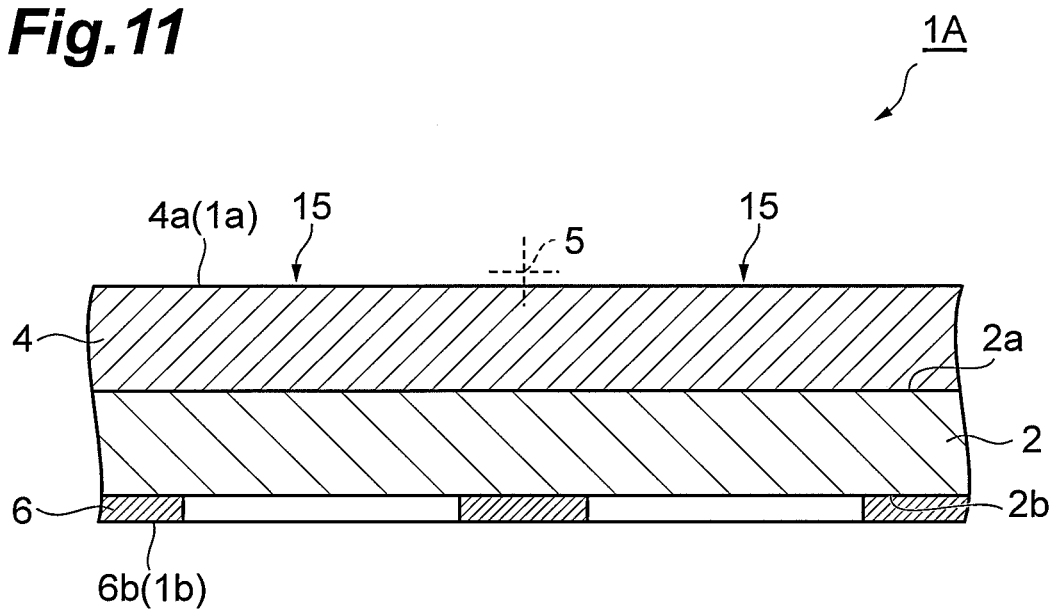
FIG. 11 is a partial sectional view of the object taken along a line to cut in FIG. 10.

FIG. 10 is a plan view of an object to be processed to which the object cutting method in accordance with the first embodiment is applied, while FIG. 11 is a partial sectional view of the object taken along a line to cut in FIG. 10. As illustrated in FIGS. 10 and 11, a sheet-like object to be processed (second object to be processed) 1A comprises an LTCC substrate 2 containing no alkali metals, a device layer 4 formed on a front face 2a of the LTCC substrate 2, and a glass layer 6 formed on a rear face 2b of the LTCC substrate 2. Here, a front face 4a of the device layer 4 becomes a front face (first-side end face) 1a of the object 1A, while a rear face 6b of the glass layer 6 becomes a rear face (second-side end face) 1b of the object 1A.

The device layer 4 is a layer containing silicon and has a plurality of functional devices 15 arranged in a matrix. Examples of the functional devices 15 include semiconductor operating layers formed by crystal growth, light-receiving devices such as photodiodes, light-emitting devices such as laser diodes, and circuit devices formed as circuits. Lines to cut 5 for cutting the object 1A into a plurality of chips are set like a grid passing between the functional devices 15 adjacent to each other.

The glass layer 6, which is a layer made of glass, such as #7740, containing an alkali metal, is formed by sputtering so as to have a thickness of about 400 nm, for example. The glass layer 6 is patterned into a grid such as to include the lines 5 when seen in the thickness direction of the object 1A.

In the following manner, the object cutting method in accordance with the first embodiment is applied to thus constructed object 1A.

First, as illustrated in FIG. 12(a), a sheet-like object to be processed for separation (first object to be processed) 10A comprising a silicon substrate 12 having main faces (i.e., front and rear faces 12a, 12b) in (100) planes is prepared. Here, since the object for separation 10A is made of the silicon substrate 12 alone, the front face 12a of the silicon substrate 12 becomes a front face (first-side end face) 10a of the object for separation 10A, while the rear face 12b of the silicon substrate 12 becomes a rear face (second-side end face) 10b of the object for separation 10A.

Subsequently, the front face 10a of the object for separation 10A and the rear face 1b of the object 1A are directly bonded to each other. This makes the rear face 1b of the object 1A oppose the main face of the silicon substrate 12. The front face 10a of the object for separation 10A and the rear face 1b of the object 1A are directly bonded to each other by anode bonding. That is, while the front face 10a of the object for separation 10A and the rear face 1b of the object 1A are in contact with each other and heated to 300° C. or higher, a positive voltage of several hundred V to several kV is applied to the object for separation 10A with reference to the object 1A. This generates an electrostatic attractive force between the objects 10A, 1A, whereby the front face 10a of the object for separation 10A and the rear face 1b of the object 1A are bonded to each other by covalent bonding.

More specifically, alkali metal ions in the glass layer 6 of the object 1A migrate toward the object for separation 10A, so that the rear face 6b of the glass layer 6 is charged negatively (polarized). Here, the object for separation 10A side is charged positively, an electrostatic attractive force occurs between the objects 10A, 1A, so that they attract each other until they come into contact with each other in an atomic level. Then, while surplus oxygen atoms existing on the front face 10a of the object for separation 10A and the rear face 1b of the object 1A are released as an oxygen gas, the remaining oxygen atoms are shared by silicon atoms in the silicon substrate 12 and glass layer 6, so that the front face 10a of the object for separation 10A and the rear face 1b of the object 1A are firmly bonded to each other.

Next, the objects 1A, 10A are secured onto a support table (not depicted) of a laser processing apparatus such that the rear face 10b of the object for separation 10A faces up. Then, as illustrated in FIG. 12(b), the object for separation 10A is irradiated with the laser light L while using its rear face 10b as a laser light entrance surface and locating the converging point P within the silicon substrate 12, and the support table is shifted, so as to move the converging point P relatively along each line to cut 5. The converging point P is relatively moved along each line to cut 5 for a plurality of times with respective distances from the rear face 10b to where the converging point P is located, so as to form, one by one, a plurality of rows of molten processed regions 13 for each line to cut 5.

Here, a fracture 17 generated in the thickness direction of the object for separation 10A from the molten processed region 13 acting as a start point is caused to reach the rear face 10b of the object for separation 10A along the line 5. The number of rows of molten processed regions 13 to be formed for each line to cut 5 varies depending on the thickness of the object for separation 10A and the like. For example, when the object for separation 10A is relatively thin, so that forming one line of molten processed region 13 for each line to cut 5 can cause the fracture 17 to reach the rear face 10b of the object for separation 10A, it is unnecessary for a plurality of rows of molten processed regions 13 to be formed for each line to cut 5.

Subsequently, as illustrated in FIG. 13(a), an expandable tape (holding member) 21 is attached to the rear face 10b of the object for separation 10A. Then, as illustrated in FIG. 13(b), the expandable tape 21 is expanded, so as to generate a stress in the object for separation 10A. That is, a force is applied to the object to be processed for separation through the expandable tape (holding member). This lets the fracture 17 reach the front face 1a of the object 1A along the lines 5 through the glass layer 6 patterned into the grid, thereby cutting the object 1A along the lines 5.

Figure 14:
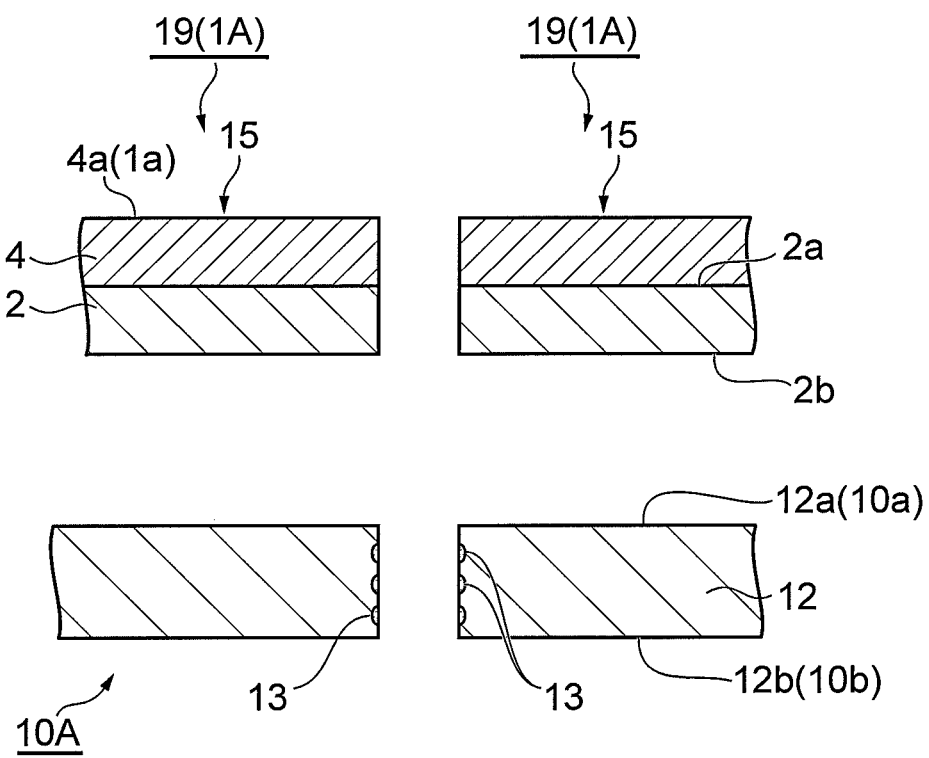
FIG. 14 is a partial sectional view of the object for explaining the object cutting method in accordance with the first embodiment.

Next, as illustrated in FIG. 14, the cut pieces of the object for separation 10A are removed from the cut pieces of the object 1A, so as to yield chips 19 each having one functional device 15. More specifically, in the state where the expandable tape 21 is expanded such that the cut pieces of the object 1A are separated from each other, a holding tape is attached to the cut pieces of the object 1 so as to cover all the cut pieces of the object 1A on the side of their functional devices 15. Thereafter, the expandable tape 21 is peeled off from the cut pieces of the object for separation 10A. That is, all the cut pieces of the objects 1A, 10A are transferred from the expandable tape 21 to the holding tape. Then, while being attached to the holding tape, the cut pieces of the objects 1A, 10A are dipped into an etching liquid such as an HF solution. This selectively etches the glass layer 6 away, so that the cut pieces of the object for separation 10A are peeled off from the cut pieces of the object 1A. While this embodiment patterns the bonding and releasing glass layer 6 into a grid, the glass layer 6 may be formed on the whole surface if it can be peeled off. However, the patterning has a merit in that it facilitates etching, thereby shortening its processing time.

In the object cutting method in accordance with the first embodiment, the rear face 1b of the object 1A and the front face 10a of the object for separation 10A are bonded to each other by anode bonding as explained in the foregoing. Therefore, the fracture 17 generated in the thickness direction of the object for separation 10A (a cleavage direction of the silicon substrate 12, i.e., a direction orthogonal to the main face of the silicon substrate 12) is reliably transmitted to the object 1A continuously without substantially changing its direction through an interface between the front face 10a of the object for separation 10A and the rear face 1b of the object 1A, so as to reach the front face 1a of the object 1A. Then, after cutting the objects 1A, 10A, the object 10A is removed from the object 1A, so as to yield the chips 19. Therefore, forming the molten processed regions 13 within the silicon substrate 12 of the object for separation 10A along the lines to cut 5 for the object 1A can accurately cut the object 1A along the lines 5 without forming any cutting start points in the object 1A. Since there are no molten processed regions 13 in the cut sections of the resulting chips 19, the bending strength of the chips 19 can be improved.

When generating a stress in the object for separation 10A, the fracture 17 generated from the molten processed region 13 acting as a start point has reached the rear face 10b of the object for separation 10A. Therefore, simply expanding the expandable tape 21 attached to the rear face 10b of the object for separation 10A makes it easy for the fractures 17 generated from the molten processed regions 13 acting as start points to extend toward the object 1A.

Forming the glass layer 6 containing an alkali metal can bond the front face 10a of the object for separation 10A and the rear face 1b of the object 1A to each other by anode bonding even when the LTCC substrate 2 containing no alkali metal is used for the object 1A. This can also prevent the device layer 4 from being contaminated with alkali metals when forming the device layer 4 on the front face 2a of the LTCC substrate 2.

The object for separation 10A is irradiated with the laser light L while using its rear face 10b as a laser light entrance surface. Therefore, the molten processed regions 13 can reliably be formed within the silicon substrate 12 of the object for separation 10A regardless of whether the object 1A to cut is easy or hard to guide the laser light L therein.

The cut pieces of the object for separation 10A are removed from the cut pieces of the object 1A by the etching. This can efficiently remove the object for separation 10A from the object 1A in order to yield the chips 19 after cutting the objects 1A, 10A.

Making the silicon substrate 12 thicker than the object 1A can further enhance the straightforwardness of the fractures 17 grown in the direction orthogonal to the main faces of the silicon substrate 12 in the object for separation 10A. In this case, the fractures 17 grown in the direction orthogonal to the main faces of the silicon substrate 12 in the object for separation 10A can more reliably be transmitted to the object 1A continuously without substantially changing its direction through the interface between the front face 10a of the object for separation 10A and the rear face 1b of the object 1A.

Second Embodiment

Figure 15:
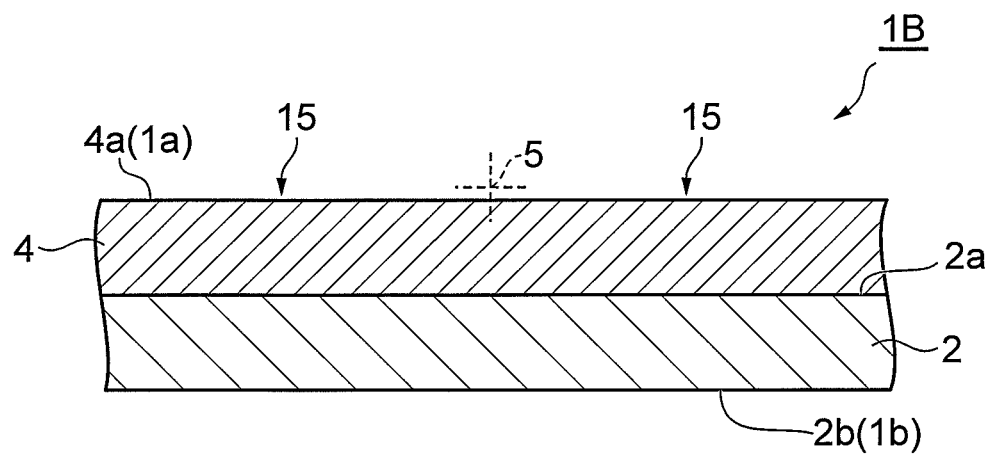
FIG. 15 is a partial sectional view, taken along a line to cut, of an object to be processed to which the object cutting method in accordance with a second embodiment is applied.

FIG. 15 is a partial sectional view, taken along a line to cut, of an object to be processed to which the object cutting method in accordance with the second embodiment is applied. As illustrated in FIG. 15, a sheet-like object to be processed (second object to be processed) 1B comprises an LTCC substrate 2 containing no alkali metals and a device layer 4 formed on a front face 2a of the LTCC substrate 2. The device layer 4 has a plurality of functional devices 15 arranged in a matrix, while lines to cut 5 are set like a grid passing between the functional devices 15 adjacent to each other. Here, a front face 4a of the device layer 4 becomes a front face (second-side end face) 1a of the object 1B, while a rear face 2b of the LTCC substrate 2 becomes a rear face (first-side end face) 1b of the object 1B.

In the following manner, the object cutting method in accordance with the second embodiment is applied to thus constructed object 1A.

First, as illustrated in FIG. 16(a), a sheet-like object to be processed for separation (first object to be processed) 10B comprising a silicon substrate 12 having main faces (i.e., front and rear faces 12a, 12b) in (100) planes and a glass layer 6 formed on the rear face 12b of the silicon substrate 12 is prepared. Here, a front face 12a of the silicon substrate 12 becomes a front face (second-side end face) 10a of the object for separation 10B, while a rear face 6b of the glass layer 6 becomes a rear face (first-side end face) 10b of the object for separation 10B.

The glass layer 6, which is a layer made of glass, such as #7740, containing an alkali metal, is formed by sputtering so as to have a thickness of about 400 nm, for example. The glass layer 6 is patterned into a grid such as to include the lines 5 when seen in the thickness direction of the object for separation 10B in the case where direct bonding which will be explained later is performed.

Subsequently, the rear face 10b of the object for separation 10B and the front face 1a of the object 1B are bonded to each other by anode bonding. This makes the front face 1a of the object 1B oppose the main face of the silicon substrate 12.

Next, as illustrated in FIG. 16(b), the object for separation 10B is irradiated with the laser light L while using its front face 10a as a laser light entrance surface and locating the converging point P within the silicon substrate 12, so as to form a plurality of rows of molten processed regions 13 for each line to cut 5 within the silicon substrate 12. Here, a fracture 17 generated in the thickness direction of the object for separation 10B from the molten processed region 13 acting as a start point is caused to reach the front face 10a of the object for separation 10B along the lines 5.

Subsequently, as illustrated in FIG. 17(a), an expandable tape 21 is attached to the front face 10a of the object for separation 10B. Then, as illustrated in FIG. 17(b), the expandable tape 21 is expanded, so as to generate a stress in the object for separation 10B. That is, a force is applied to the object to be processed for separation through the expandable tape (holding member). This lets the fracture 17 reach the rear face 1b of the object 1B along the lines 5 through the glass layer 6 patterned into the grid, thereby cutting the object 1B along the lines 5.

Figure 18:
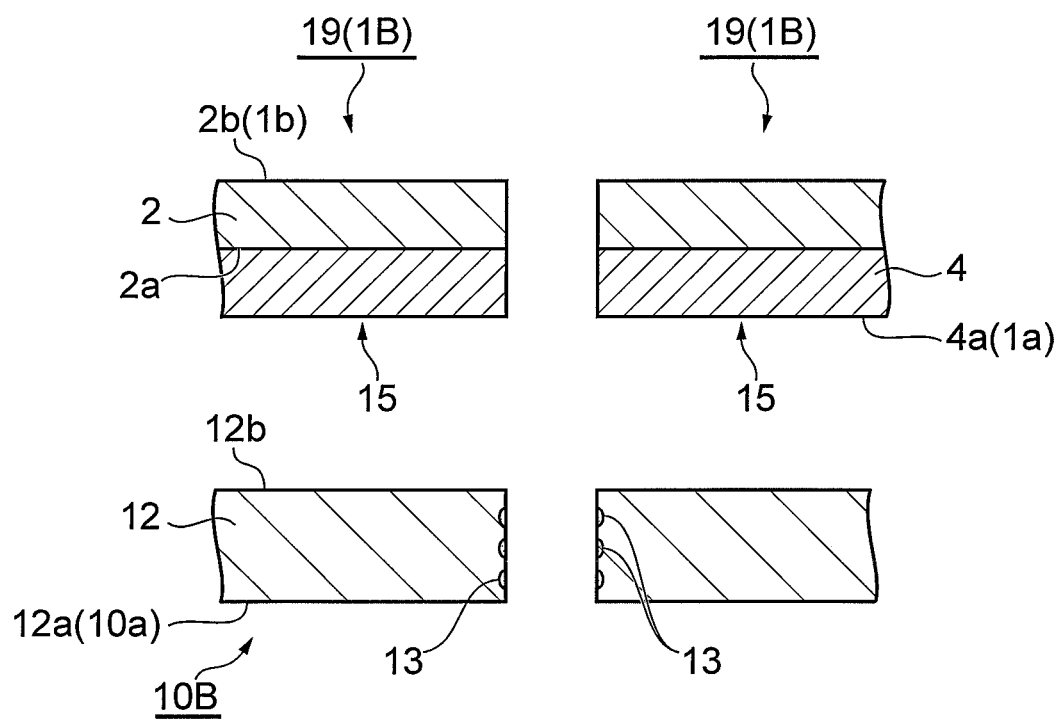
FIG. 18 is a partial sectional view of the object for explaining the object cutting method in accordance with the second embodiment.

Next, as illustrated in FIG. 18, the cut pieces of the object for separation 10B are removed from the cut pieces of the object 1B, so as to yield chips 19 each having one functional device 15. More specifically, all the cut pieces of the objects 1B, 10B are transferred from the expandable tape 21 to the holding tape. Then, while being attached to the holding tape, the cut pieces of the objects 1B, 10B are dipped into an etching liquid such as an HF solution. This selectively etches the glass layer 6 away, so that the cut pieces of the object for separation 10B are peeled off from the cut pieces of the object 1B.

As explained in the foregoing, like the above-mentioned object cutting method in accordance with the first embodiment, forming the molten processed regions 13 within the silicon substrate 12 of the object for separation 10B along the lines to cut 5 for the object 1B can accurately cut the object 1B along the lines 5 without forming any cutting start points in the object 1B in the object cutting method in accordance with the second embodiment.

Third Embodiment

Figure 19:
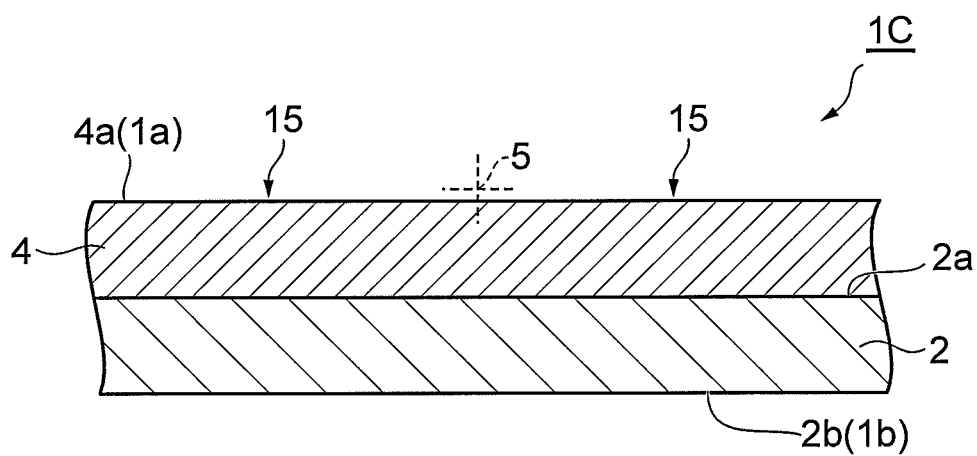
FIG. 19 is a partial sectional view, taken along a line to cut, of an object to be processed to which the object cutting method in accordance with a third embodiment is applied.

FIG. 19 is a partial sectional view, taken along a line to cut, of an object to be processed to which the object cutting method in accordance with the third embodiment is applied. As illustrated in FIG. 19, a sheet-like object to be processed (second object to be processed) 1C comprises an LTCC substrate 2 containing no alkali metals and a device layer 4 formed on a front face 2a of the LTCC substrate 2. The device layer 4 has a plurality of functional devices 15 arranged in a matrix, while lines to cut 5 are set like a grid passing between the functional devices 15 adjacent to each other. Here, a front face 4a of the device layer 4 becomes a front face (first-side end face) 1a of the object 1C, while a rear face 2b of the LTCC substrate 2 becomes a rear face (second-side end face) 1b of the object 1C.

In the following manner, the object cutting method in accordance with the third embodiment is applied to thus constructed object 1C.

First, as illustrated in FIG. 20(a), a sheet-like object to be processed for separation (first object to be processed) 10C comprising a silicon substrate 12 having main faces (i.e., front and rear faces 12a, 12b) in (100) planes is prepared. Here, since the object for separation 10C is made of the silicon substrate 12 alone, the front face 12a of the silicon substrate 12 becomes a front face (first-side end face) 10a of the object for separation 10C, while the rear face 12b of the silicon substrate 12 becomes a rear face (second-side end face) 10b of the object for separation 10C.

The front face 10a of the object for separation 10C (i.e., the front face 12a of the silicon substrate 12) is formed with depressions 14 arranged in a matrix so as to oppose the functional devices 15 when seen in the thickness direction of the object for separation 10C in the case where direct bonding which will be explained is performed. Therefore, a remaining part 16 separating the adjacent depressions 14 from each other is patterned into a grid so as to include the lines to cut 5 when seen in the thickness direction of the object for separation 10C in the case where direct bonding which will be explained later is performed. A molten processed region for separation (for peeling) 18 is formed flatly in the remaining part 16.

Subsequently, the front face 10a of the object for separation 10C and the rear face 1b of the object 1C are directly bonded to each other. This makes the rear face 1b of the object 1C oppose the main face of the silicon substrate 12. The front face 10a of the object for separation 10C and the rear face 1b of the object 1C are bonded to each other by surface-activated direct bonding.

More specifically, in a vacuum, the front face 10a of the object for separation 10C and the rear face 1b of the object 1C are irradiated with ion beams of an inert gas or the like, so as to remove oxides, adsorbed molecules, and the like. As a consequence, in atoms exposed to the front face 10a of the object for separation 10C and the rear face 1b of the object 1C, bonds for forming a chemical combination partly lose their counterparts and thus exhibit a strong binding force for other atoms. When the front face 10a of the object for separation 10C and the rear face 1b of the object 1C are brought into contact with each other in this state, the front face 10a and the rear face 1b are firmly bonded to each other.

Next, as illustrated in FIG. 20(b), the object for separation 10C is irradiated with the laser light L while using its rear face 10b as a laser light entrance surface and locating the converging point P within the silicon substrate 12, so as to form a plurality of rows of molten processed regions 13 for each line to cut 5. Here, a fracture 17 generated in the thickness direction of the object for separation 10C from the molten processed region 13 acting as a start point is caused to reach the rear face 10b of the object for separation 10C along the lines 5.

Subsequently, as illustrated in FIG. 21(a), an expandable tape 21 is attached to the rear face 10b of the object for separation 10C. Then, as illustrated in FIG. 21(b), the expandable tape 21 is expanded, so as to generate a stress in the object for separation 10C. That is, a force is applied to the object to be processed for separation through the expandable tape (holding member). This lets the fracture 17 reach the front face 1a of the object 1C along the lines 5 through the remaining part 16 patterned into the grid, thereby cutting the object 1C along the lines 5.

Figure 22:
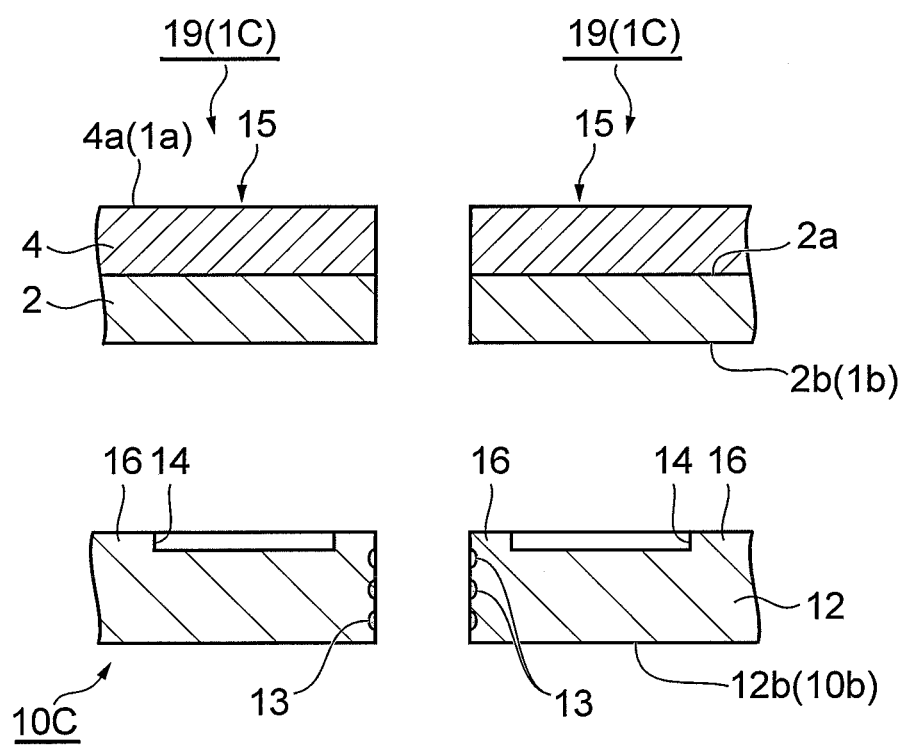
FIG. 22 is a partial sectional view of the object for explaining the object cutting method in accordance with the third embodiment.

Next, as illustrated in FIG. 22, the cut pieces of the object for separation 10C are removed from the cut pieces of the object 1C, so as to yield chips 19 each having one functional device 15. More specifically, all the cut pieces of the objects 1C, 10C are transferred from the expandable tape 21 to the holding tape. Then, while being attached to the holding tape, the cut pieces of the objects 1C, 10C are dipped into an etching liquid such as a KOH solution. This relatively rapidly (selectively) etches away the remaining part 16 formed with the molten processed region for separation 18 in the object for separation 10C, so that the cut pieces of the object for separation 10C are peeled off from the cut pieces of the object 1C. Here, the molten processed region for separation is selectively etched away, since its etching rate is higher than that in unmodified regions because of a number of minute fractures formed therein and the denaturalization of its materials and the like.

As explained in the foregoing, like the above-mentioned object cutting method in accordance with the first embodiment, forming the molten processed regions 13 within the silicon substrate 12 of the object for separation 10C along the lines to cut 5 for the object 1C can accurately cut the object 1C along the lines 5 without forming any cutting start points in the object 1C in the object cutting method in accordance with the third embodiment.

Figure 23:
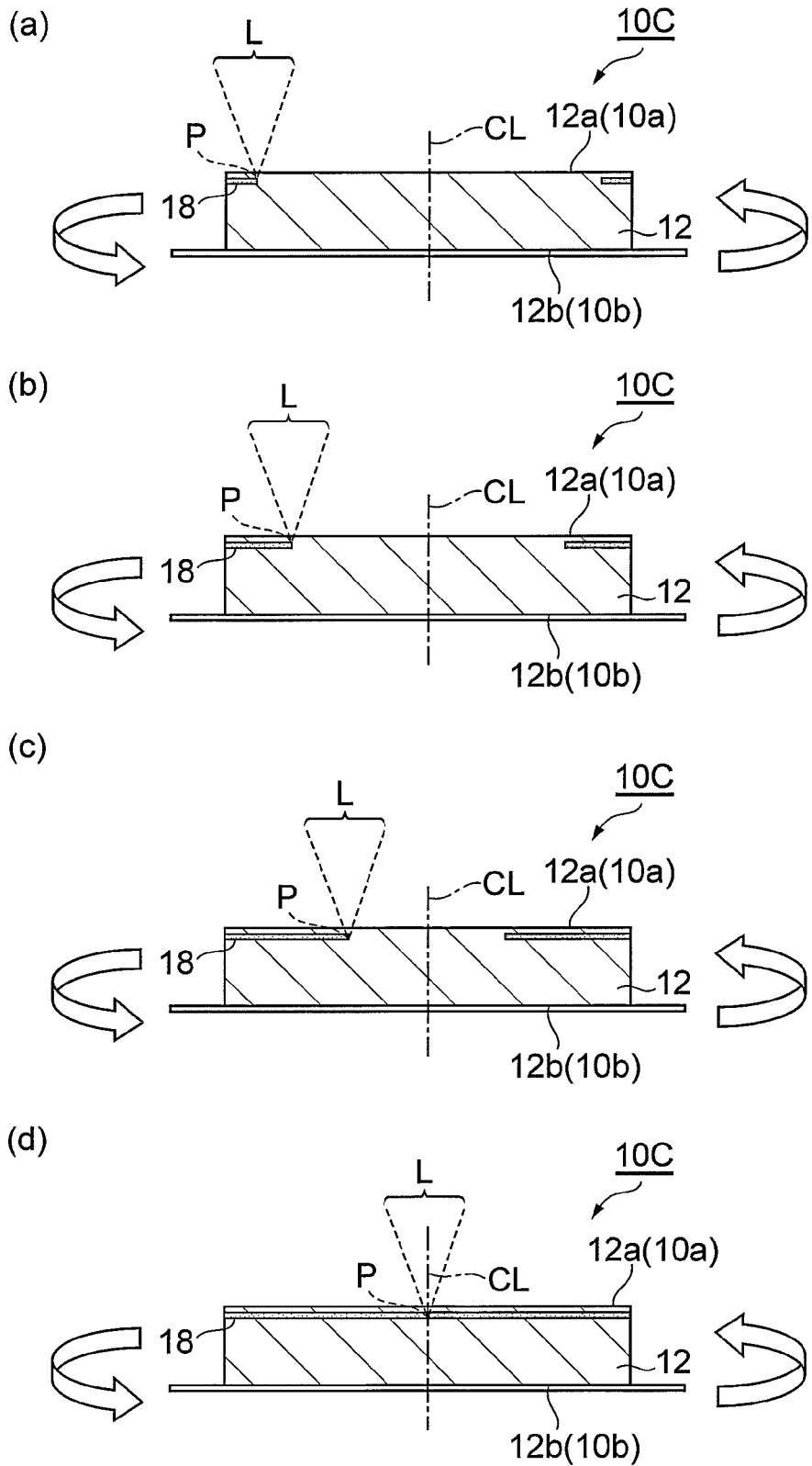
FIG. 23 is a sectional view of the object for explaining an example of forming a molten processed region for separation in an object to be processed for separation.

The following is an example of forming the molten processed region for separation 18 for the object for separation 10C. As illustrated in FIG. 23(a), the object for separation 10C is rotated about its center line CL. Then, as illustrated in FIGS. 23(a) to (d), the object for separation 10C is irradiated with the laser light L, while using its front face 10a as a laser light entrance surface and locating the converging point P in the vicinity of the front face 12a of the silicon substrate 12, with the converging point P relatively moving from an outer peripheral part of the object for separation 10C toward the center part thereof. This forms the molten processed region for separation 18 flatly in the vicinity of the front face 10a of the object for separation 10C (i.e., in the vicinity of the front face 12a of the silicon substrate 12).

Of course, the rear face 10b of the object for separation 10C may be used as a laser light entrance surface, and the converging point P may be moved relatively from the center part of the object for separation 10C toward the outer peripheral part. The object for separation 10C may be formed with the depressions 14 before or after forming the object for separation 10C with the molten processed region for separation 18. The object for separation 10C may also be formed with the molten processed region for separation 18 after bonding the front face 10a of the object for separation 10C and the rear face 1b of the object 1C to each other.

Fourth Embodiment

Figure 24:
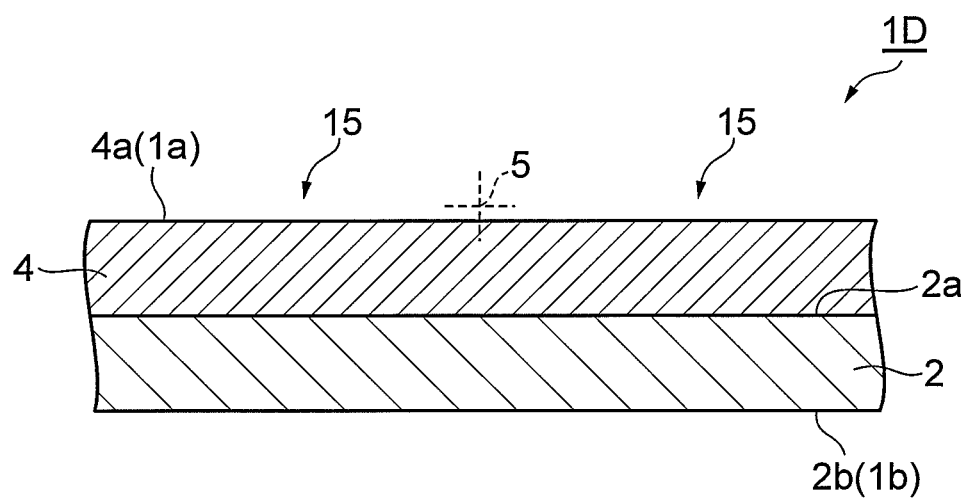
FIG. 24 is a partial sectional view, taken along a line to cut, of an object to be processed to which the object cutting method in accordance with a fourth embodiment is applied.

FIG. 24 is a partial sectional view, taken along a line to cut, of an object to be processed to which the object cutting method in accordance with the fourth embodiment is applied. As illustrated in FIG. 24, a sheet-like object to be processed (second object to be processed) 1D has a structure similar to that of the above-mentioned object 1C in the third embodiment. Here, the front face 4a of the device layer 4 becomes a front face (second-side end face) 1a of the object 1D, while the rear face 2b of the LTCC substrate 2 becomes a rear face (first-side end face) 1b of the object 1D.

In the following manner, the object cutting method in accordance with the fourth embodiment is applied to thus constructed object 1D.

Figure 25:
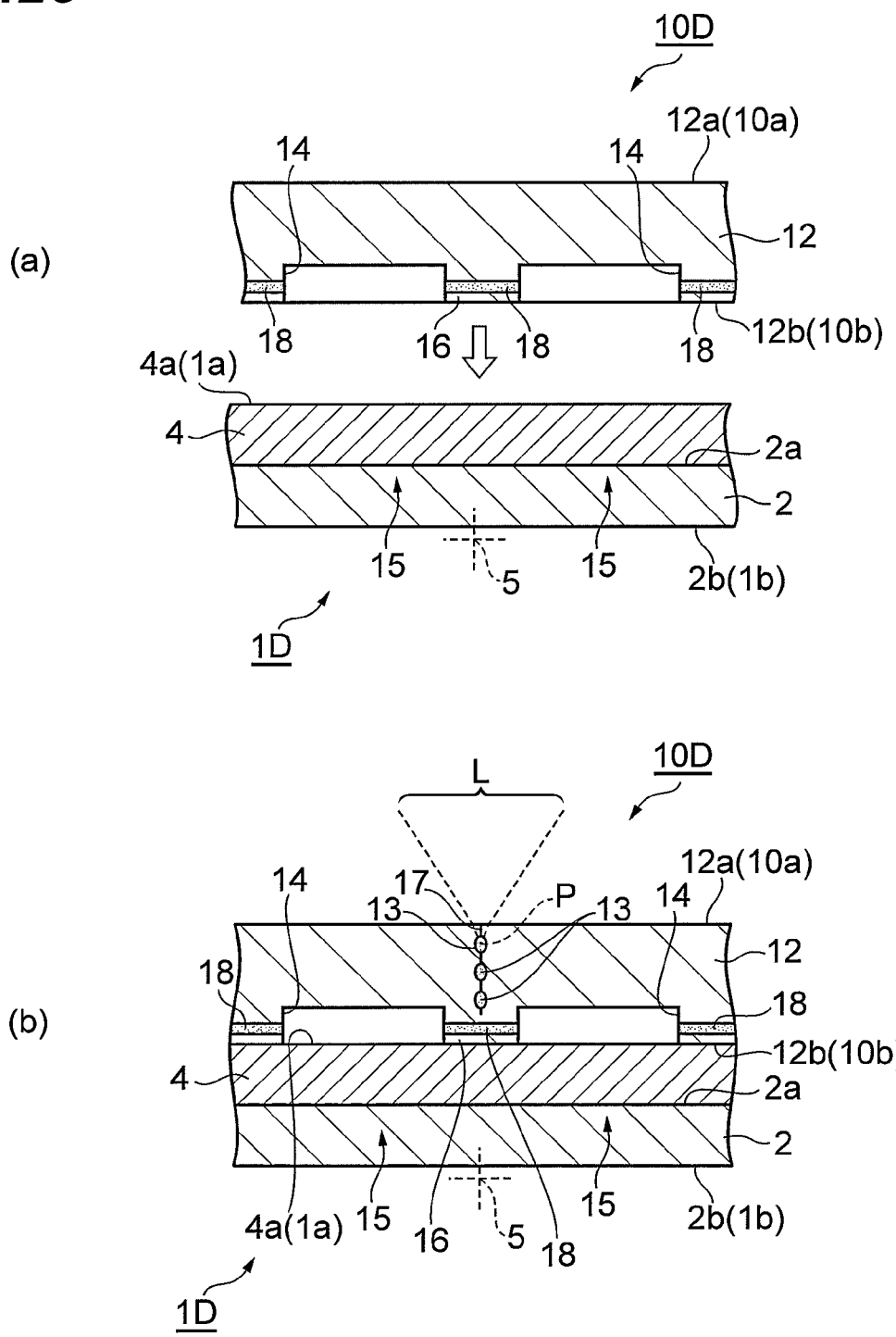
FIG. 25 is a partial sectional view of the object for explaining the object cutting method in accordance with the fourth embodiment.

First, as illustrated in FIG. 25(a), a sheet-like object to be processed for separation (first object to be processed) 10D comprising a silicon substrate 12 having main faces (i.e., front and rear faces 12a, 12b) in (100) planes is prepared. Here, since the object for separation 10D is made of the silicon substrate 12 alone, the front face 12a of the silicon substrate 12 becomes a front face (second-side end face) 10a of the object for separation 10D, while the rear face 12b of the silicon substrate 12 becomes a rear face (first-side end face) 10b of the object for separation 10D.

The rear face 10b of the object for separation 10D (i.e., the rear face 12b of the silicon substrate 12) is formed with depressions 14 arranged in a matrix so as to oppose the functional devices 15 when seen in the thickness direction of the object for separation 10D in the case where direct bonding which will be explained is performed. Therefore, a remaining part 16 separating the adjacent depressions 14 from each other is patterned into a grid so as to include the lines to cut 5 when seen in the thickness direction of the object for separation 10D in the case where direct bonding which will be explained later is performed. A molten processed region for separation 18 is formed flatly in the remaining part 16.

Subsequently, the rear face 10b of the object for separation 10D and the front face 1a of the object 1D are bonded to each other by surface-activated direct bonding. This causes the front face 1a of the object 1D to oppose the main face of the silicon substrate 12.

Next, as illustrated in FIG. 25(b), the object for separation 10D is irradiated with the laser light L while using its front face 10a as a laser light entrance surface and locating the converging point P within the silicon substrate 12, so as to form a plurality of rows of molten processed regions 13 for each line to cut 5. Here, a fracture 17 generated in the thickness direction of the object for separation 10D from the molten processed region 13 acting as a start point is caused to reach the front face 10a of the object for separation 10D along the lines 5.

Subsequently, as illustrated in FIG. 26(a), an expandable tape 21 is attached to the front face 10a of the object for separation 10D. Then, as illustrated in FIG. 26(b), the expandable tape 21 is expanded, so as to generate a stress in the object for separation 10D. That is, a force is applied to the object to be processed for separation through the expandable tape (holding member). This lets the fracture 17 reach the rear face 1b of the object 1D along the lines 5 through the remaining part 16 patterned into the grid, thereby cutting the object 1D along the lines 5.

Figure 27:
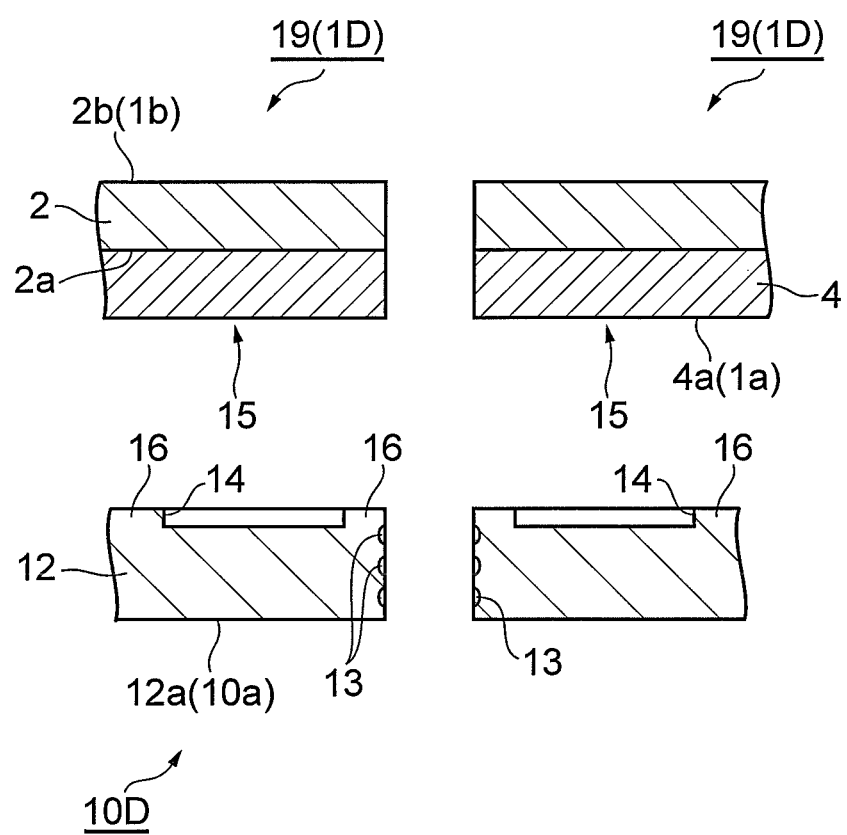
FIG. 27 is a partial sectional view of the object for explaining the object cutting method in accordance with the fourth embodiment.

Next, as illustrated in FIG. 27, the cut pieces of the object for separation 10D are removed from the cut pieces of the object 1D, so as to yield chips 19 each having one functional device 15. More specifically, all the cut pieces of the objects 1D, 10D are transferred from the expandable tape 21 to the holding tape. Then, while being attached to the holding tape, the cut pieces of the objects 1D, 10D are dipped into an etching liquid such as a KOH solution. This relatively rapidly (selectively) etches away the remaining part 16 formed with the molten processed region for separation 18 in the object for separation 10D, so that the cut pieces of the object for separation 10D are peeled off from the cut pieces of the object 1D.

As explained in the foregoing, like the above-mentioned object cutting method in accordance with the first embodiment, forming the molten processed regions 13 within the silicon substrate 12 of the object for separation 10D along the lines to cut 5 for the object 1D can accurately cut the object 1D along the lines 5 without forming any cutting start points in the object 1D in the object cutting method in accordance with the fourth embodiment.

Fifth Embodiment

Figure 28:
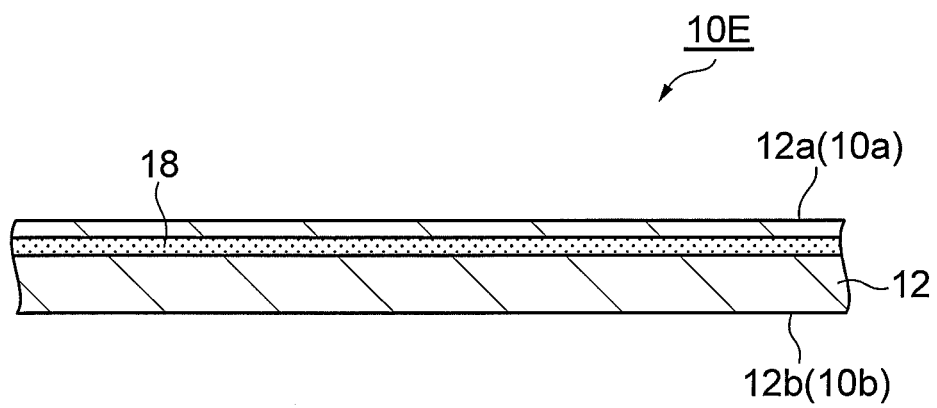
FIG. 28 is a partial sectional view, taken along a line to cut, of an object to be processed to which the object cutting method in accordance with a fifth embodiment is applied.

FIG. 28 is a partial sectional view, taken along a line to cut, of an object to be processed to which the object cutting method in accordance with the fifth embodiment is applied. First, as illustrated in FIG. 28, a sheet-like object to be processed for separation (first object to be processed) 10E comprising a silicon substrate 12 having main faces (i.e., front and rear faces 12a, 12b) in (100) planes is prepared. Here, since the object for separation 10E is made of the silicon substrate 12 alone, the front face 12a of the silicon substrate 12 becomes a front face (first-side end face) 10a of the object for separation 10E, while the rear face 12b of the silicon substrate 12 becomes a rear face (second-side end face) 10b of the object for separation 10E.

Here, a molten processed region for separation 18 is formed flatly in the vicinity of the front face 10a of the object for separation 10E (i.e., the front face 12a of the silicon substrate 12). The molten processed region for separation 18 is formed such as to be located at least closer to the front face 12a than is the center position in the thickness direction of the silicon substrate 12.

Subsequently, as illustrated in FIG. 29(a), a shield layer 22 is formed on the front face 10a of the object for separation 10E. Then, a plurality of insulating resin layers 23 and a plurality of wiring layers 24 are stacked alternately on the shield layer 22, and a connection terminal layer 25 is finally formed thereon. This yields an object to be processed (second object to be processed) 1E having a plurality of circuit modules 26 arranged in a matrix. Lines to cut 5 for cutting the object 1E into a plurality of chips are set like a grid passing between the circuit modules 26 adjacent to each other. Here, a front face 25a of the connection terminal layer 25 becomes a front face (first-side end face) 1a of the object 1E, while a rear face 22b of the shield layer 22 becomes a rear face (second-side end face) 1b of the object 1E.

Bonding the front face 10a of the object for separation 10E and the rear face 1b of the object 1E to each other also encompasses a mode in which the object 1E is thus directly formed on the front face 10a of the object for separation 10E. This causes the rear face 1b of the object 1E to oppose the main face of the silicon substrate 12.

Next, as illustrated in FIG. 29(b), the object for separation 10E is irradiated with the laser light L while using its rear face 10b as a laser light entrance surface and locating the converging point P within the silicon substrate 12, so as to form a plurality of rows of molten processed regions 13 for each line to cut 5 within the silicon substrate 12. Here, a fracture 17 generated in the thickness direction of the object for separation 10E from the molten processed region 13 acting as a start point is caused to reach the rear face 10b of the object for separation 10E along the lines 5.

Subsequently, as illustrated in FIG. 30(a), an expandable tape 21 is attached to the rear face 10b of the object for separation 10E. Then, as illustrated in FIG. 30(b), the expandable tape 21 is expanded, so as to generate a stress in the object for separation 10E. That is, a force is applied to the object to be processed for separation through the expandable tape (holding member). This lets the fracture 17 reach the front face 1a of the object 1E along the lines 5, thereby cutting the object 1E along the lines 5.

Figure 31:
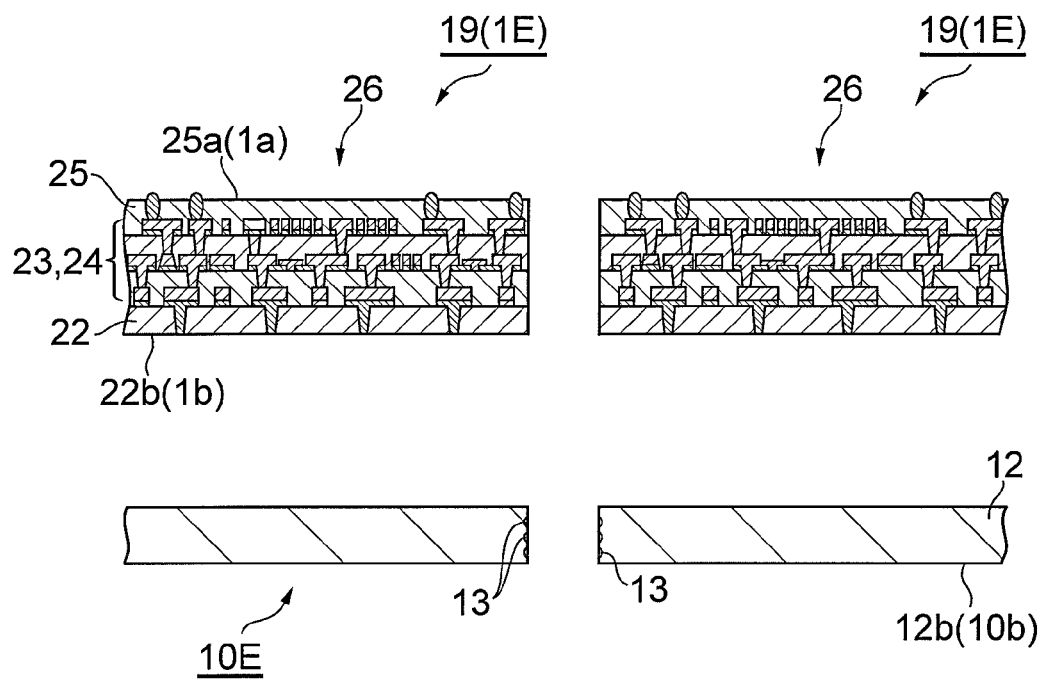
FIG. 31 is a partial sectional view of the object for explaining the object cutting method in accordance with the fifth embodiment.

Next, as illustrated in FIG. 31, the cut pieces of the object for separation 10E are removed from the cut pieces of the object 1E, so as to yield chips 19 corresponding to the respective circuit modules 26. More specifically, all the cut pieces of the objects 1E, 10E are transferred from the expandable tape 21 to the holding tape. Then, while being attached to the holding tape, the cut pieces of the objects 1E, 10E are dipped into an etching liquid such as a KOH solution. This relatively rapidly (selectively) etches away the part formed with the molten processed region for separation 18 in the object for separation 10E, so that the cut pieces of the object for separation 10E are peeled off from the cut pieces of the object 1E.

As explained in the foregoing, like the above-mentioned object cutting method in accordance with the first embodiment, forming the molten processed regions 13 within the silicon substrate 12 of the object for separation 10E along the lines to cut 5 for the object 1E can accurately cut the object 1E along the lines 5 without forming any cutting start points in the object 1E in the object cutting method in accordance with the fifth embodiment.

Sixth Embodiment

Figure 32:
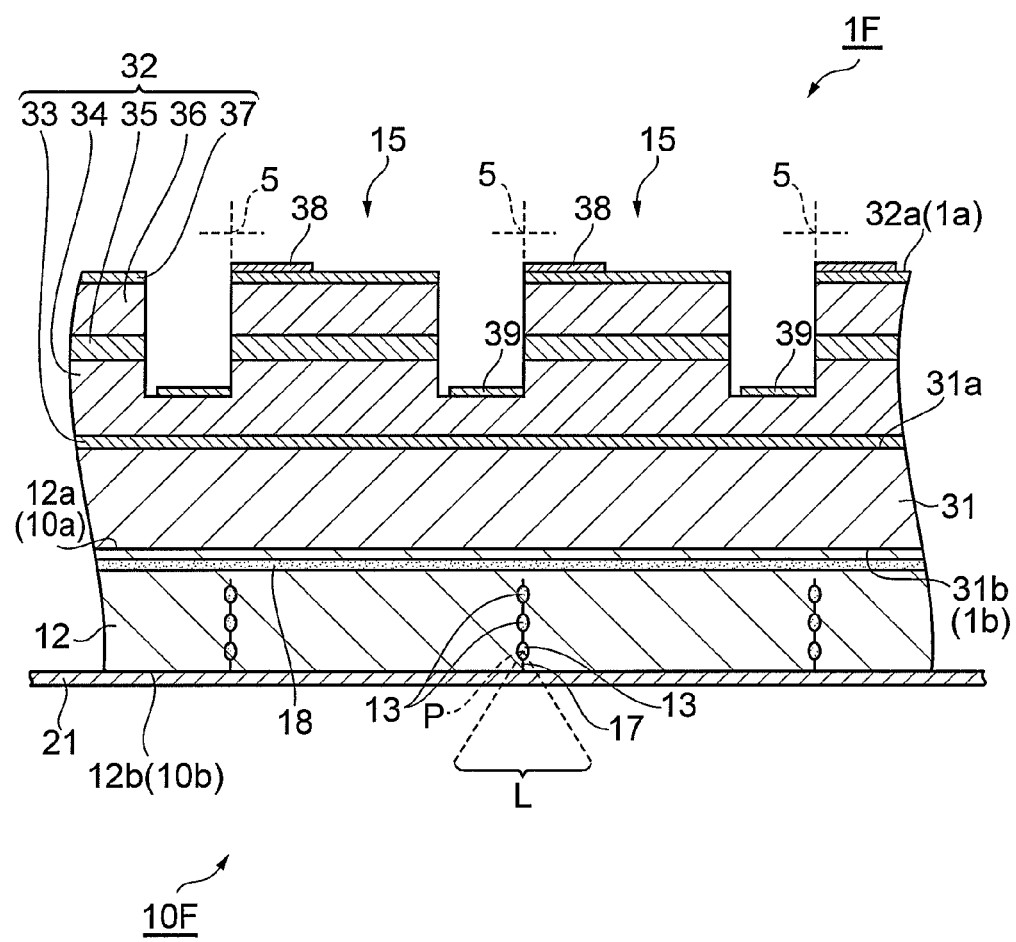
FIG. 32 is a partial sectional view, taken along a line to cut, of an object to be processed to which the object cutting method in accordance with a sixth embodiment is applied.

FIG. 32 is a partial sectional view, taken along a line to cut, of an object to be processed to which the object cutting method in accordance with the sixth embodiment is applied. As illustrated in FIG. 32, a sheet-like object to be processed (second object to be processed) 1F comprises a sapphire substrate 31 and a semiconductor layer 32 formed on a front face 31a of the sapphire substrate 31. The semiconductor layer 32 has a plurality of functional devices 15 arranged in a matrix, while lines to cut 5 are set like a grid passing between functional devices 15 adjacent to each other. Here, a front face 32a of the semiconductor layer 32 becomes a front face (first-side end face) 1a of the object 1F, while a rear face 31b of the sapphire substrate 31 becomes a rear face (second-side end face) 1b of the object 1F.

Each functional device 15, which functions as an LED, comprises a buffer layer 33, an n-type GaN cladding layer 34, an InGaN/GaN active layer 35, a p-type GaN cladding layer 36, and a p-type light-transmitting electrode layer 37 which are stacked in this order from the sapphire substrate 31 side. A p-type electrode 38 is formed in a partial region on the p-type light-transmitting electrode layer 37, while an n-type electrode 39 is formed in a partial region on the n-type GaN cladding layer 34.

In the following manner, the object cutting method in accordance with the sixth embodiment is applied to thus constructed object 1F.

First, a sheet-like object to be processed for separation (first object to be processed) 10F comprising a silicon substrate 12 having main faces (i.e., front and rear faces 12a, 12b) in (100) planes is prepared. Here, since the object for separation 10F is made of the silicon substrate 12 alone, the front face 12a of the silicon substrate 12 becomes a front face (first-side end face) 10a of the object for separation 10F, while the rear face 12b of the silicon substrate 12 becomes a rear face (second-side end face) 10b of the object for separation 10F.

Here, a molten processed region for separation 18 is formed flatly in the vicinity of the front face 10a of the object for separation 10F (i.e., the front face 12a of the silicon substrate 12). The molten processed region for separation 18 is formed such as to be located at least closer to the front face 12a than is the center position in the thickness direction of the silicon substrate 12.

Next, the front face 10a of the object for separation 10F and the rear face 1b of the object 1F are bonded to each other by surface-activated direct bonding. This causes the rear face 1b of the object 1F to oppose the main face of the silicon substrate 12.

Subsequently, the object for separation 10F is irradiated with the laser light L while using its rear face 10b as a laser light entrance surface and locating the converging point P within the silicon substrate 12, so as to form a plurality of rows of molten processed regions 13 for each line to cut 5 within the silicon substrate 12. Here, a fracture 17 generated in the thickness direction of the object for separation 10F from the molten processed region 13 acting as a start point is caused to reach the rear face 10b of the object for separation 10F along the lines 5.

Thereafter, an expandable tape 21 is attached to the rear face 10b of the object for separation 10F. Then, the expandable tape 21 is expanded, so as to generate a stress in the object for separation 10F. That is, a force is applied to the object to be processed for separation through the expandable tape (holding member). This lets the fracture 17 reach the front face 1a of the object 1F along the lines 5, thereby cutting the object 1F along the lines 5.

Next, as illustrated in FIG. 33(a), the cut pieces of the object for separation 10F are removed from the cut pieces of the object 1F, and a heat sink 41 is attached to the rear face 31b of each cut piece of the sapphire substrate 31, so as to yield LED chips 42A each having one functional device 15. More specifically, all the cut pieces of the objects 1F, 10F are transferred from the expandable tape 21 to the holding tape. Then, while being attached to the holding tape, the cut pieces of the objects 1F, 10F are dipped into an etching liquid such as a KOH solution. This relatively rapidly (selectively) etches away the part formed with the molten processed region for separation 18 in the object for separation 10F, so that the cut pieces of the object for separation 10F are peeled off from the cut pieces of the object 1F.

As explained in the foregoing, like the above-mentioned object cutting method in accordance with the first embodiment, forming the molten processed regions 13 within the silicon substrate 12 of the object for separation 10F along the lines to cut 5 for the object 1F can accurately cut the object 1F along the lines 5 without forming any cutting start points in the object 1F in the object cutting method in accordance with the sixth embodiment. Since cut sections of the resulting LED chips 42A are free of irregularities such as the molten processed regions 13, the bending strength of the LED chips 42A can be improved, while the light extraction efficiency from end faces of the LED chips 42A can be ameliorated.

Though such a stress as to deflect the sapphire substrate 31 occurs under the influence of the GaN layer within the semiconductor layer 32, bonding the rear face 1b of the object 1F to the front face 10a of the object for separation 10F can prevent the sapphire substrate 31 from deflecting.

For yielding the LED chips 42A, the cut pieces of the object for separation 10F are removed from the cut pieces of the object 1F, and the heat sink 41 is attached to the rear face 31b of each cut piece of the sapphire substrate 31. This makes the heatsink 41 approach the active layer 35 by the thickness by which the cut piece of the object for separation 10F is removed, whereby the cooling efficiency of the LED chips 42A can be improved.

As illustrated in FIG. 33(b), the heatsink 41 may be attached to the rear face 10b of the cut piece of the object for separation 10F without removing the cut piece of the object for separation 10F from the cut piece of the object 1F, so as to yield an LED chip 42B having one functional device 15. In this case, the cut piece of the object for separation 10F becomes a reflecting layer for the light generated in the active layer 35, whereby the light emission intensity of the LED chip 42B can be improved.

Examples of the present invention will now be explained.

Figure 34:
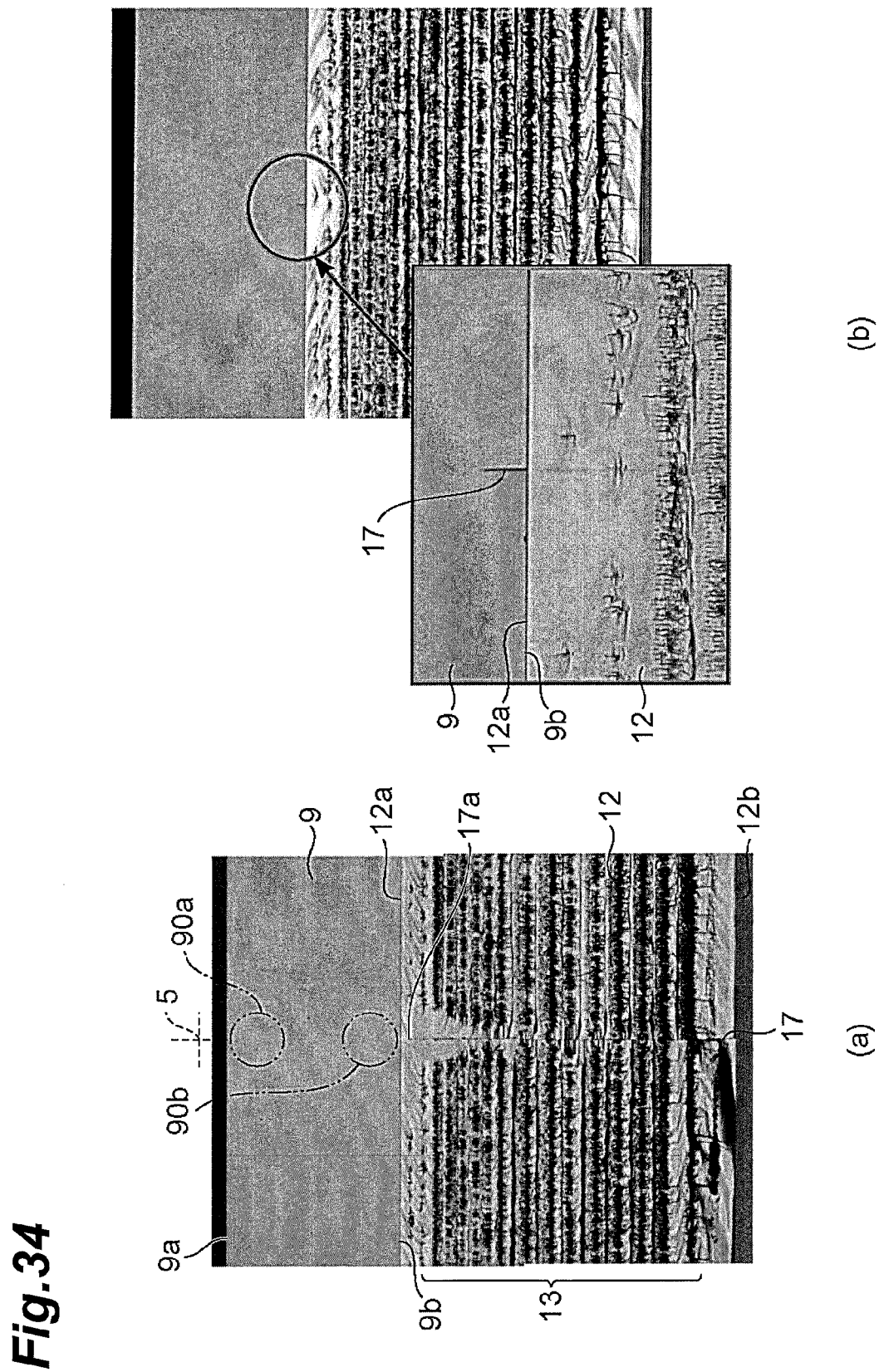
FIG. 34 is a view representing photographs of cross sections of silicon and glass substrates in which modified regions were formed by an example.

As illustrated in FIG. 34(a), a rear face 9b of a glass substrate 9 having a thickness of 0.5 mm was bonded by anode bonding to a front face 12a of a silicon substrate 12 having a thickness of 1 mm. Then, lines to cut 5 were set such as to cut the glass substrate 9 into chips each having a square form of 2 mm×2 mm, and 18 rows of molten processed regions 13 were formed within the silicon substrate 12 for each line to cut 5. In the photograph of FIG. 34(a), the molten processed regions 13 were also formed along the lines 5 in the direction perpendicular to the sheet. Here, a fracture 17 generated in the thickness direction of the silicon substrate 12 from the molten processed region 13 acting as a start point reached the rear face 12b of the silicon substrate 12 but not the front face 12a thereof. That is, a leading end 17a of the fracture 17 on the front face 12a side was separated from the front face 12a within the silicon substrate 12. A tensile stress occurred in a part 90b on the rear face 9b side of the glass substrate 9 along the lines 5, while a compressive stress occurred in a part 90a on the front face 9a side of the glass substrate 9 along the lines 5.

In this state, an expandable tape attached to the rear face 12b of the silicon substrate 12 was expanded, so as to generate a stress in the silicon substrate 12. This caused the fracture 17 to extend into the glass substrate 9 through the interface between the front face 12a of the silicon substrate 12 and the rear face 9b of the glass substrate 9, so as to reach the front face 9a of the glass substrate 9, thereby cutting the glass substrate 9 along the lines 5. FIG. 34(b) is a photograph taken immediately after the fracture 17 entered the glass substrate 9; the fracture 17 grown in the direction orthogonal to the main face in the silicon substrate 12 was thus transmitted to the glass substrate 9 continuously without substantially changing its direction through the interface between the front face 12a of the silicon substrate 12 and the rear face 9b of the glass substrate 9.

Figure 35:
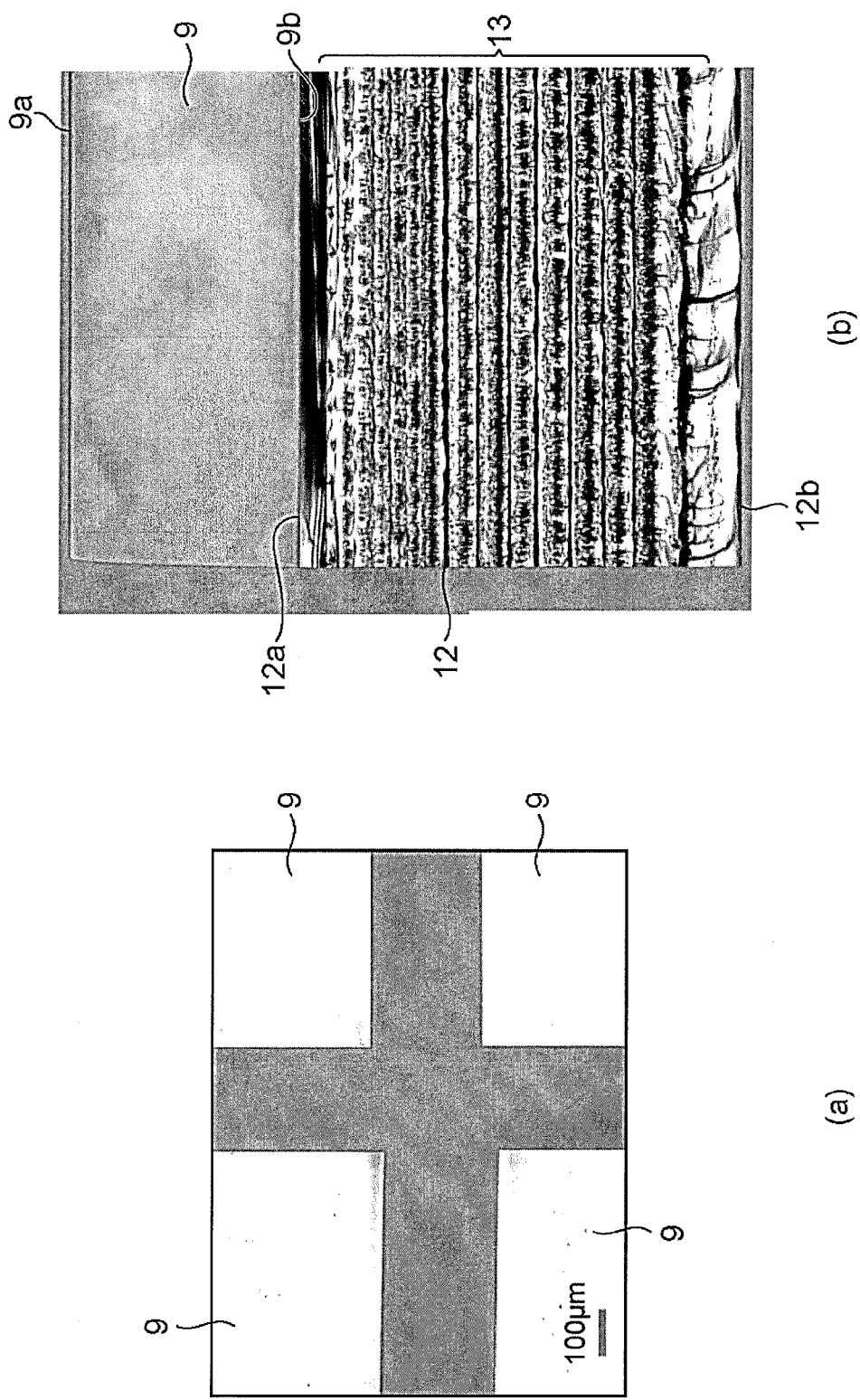
FIG. 35 is a view representing photographs of cross sections of silicon and glass substrates cut by the example.

FIG. 35 is a view representing photographs of cross sections of silicon and glass substrates cut by the above-mentioned example. The glass substrate 9 is seen to have been cut accurately along the lines 5 when the cut silicon substrate 12 and glass substrate 9 are observed from the front face 9a side of the glass substrate 9 as illustrated in FIG. 35(a) or from a side face side as illustrated in FIG. 35(b). The cut section of the silicon substrate 12 and the cut section of the glass substrate 9 were continuous with each other in a direction parallel to the thickness direction without substantially shifting from each other.

Figure 36:
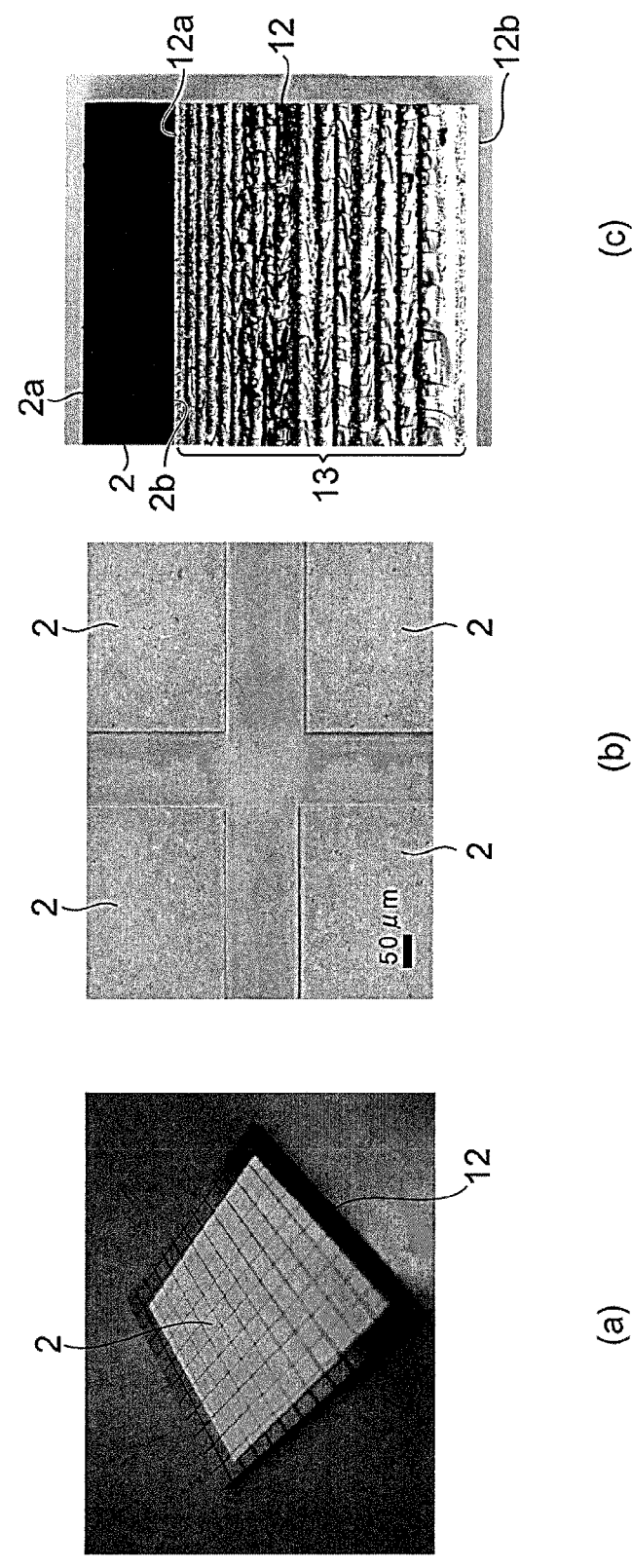
FIG. 36 is a view representing photographs of cross sections of silicon and LTCC substrates cut by an example.

FIG. 36 is a view representing photographs of cross sections of silicon and LTCC substrates cut by another example. Here, a rear face 2b of an LTCC substrate 2 having a square form of 20 mm×20 mm with a thickness of 0.3 mm was bonded by anode bonding to a front face 12a of a silicon substrate 12 having a square form of 25 mm×25 mm with a thickness of 1 mm. Then, lines to cut 5 were set such as to cut the LTCC substrate 2 into chips each having a square form of 2 mm×2 mm, and 18 rows of molten processed regions 13 were formed within the silicon substrate 12 for each line to cut 5. This caused the fracture generated in the thickness direction of the silicon substrate 12 from the molten processed region 13 acting as a start point to reach the rear face 12b of the silicon substrate 12.

In this state, an expandable tape attached to the rear face 12b of the silicon substrate 12 was expanded, so as to generate a stress in the silicon substrate 12. This caused the fracture generated from the molten processed region 13 acting as a start point to reach the front face 2a of the LTCC substrate 2 along the lines 5 as illustrated in FIG. 36(a), thereby cutting the LTCC substrate 2 along the lines 5. The photograph of FIG. 36(a) illustrates how the LTCC substrate 2 was cut so as to follow the cutting of the silicon substrate 12.

The LTCC substrate 2 is seen to have been cut accurately along the lines 5 when the cut silicon substrate 12 and LTCC substrate 2 are observed from the front face 2a side of the LTCC substrate 2 as illustrated in FIG. 36(b) or from a side face side as illustrated in FIG. 36(c). The cut section of the silicon substrate 12 and the cut section of the LTCC substrate 2 were continuous with each other in a direction parallel to the thickness direction without substantially shifting from each other.

When a silicon substrate having a main face in a (111) plane is used for an object to be processed for separation, its cleavage direction forms an angle of 53.7° with the main face. Therefore, in order for the fracture generated from the molten processed region acting as a start point to extend in a direction perpendicular to the main face, it is necessary to increase the number of rows of molten processed regions formed for each line to cut or form the molten processed region at a position closer to the interface between the object for separation and the object to cut as compared with the case where a silicon substrate having a main face in a (100) plane is used for the object for separation.

However, it has been found that increasing the number of rows of molten processed regions or forming the molten processed region at a position closer to the interface generates a large number of minute fractures in the object to cut at the time when the molten processed region is formed. When such a large number of minute fractures occur, the cut section of the object to cut may meander and so forth, thereby lowering the accuracy in cutting the object along lines to cut. This makes it clear that using a silicon substrate having a main face in a (100) plane as an object to be processed for separation is very effective.

For cutting an object to be processed having a front face formed with a structure or a multilayer body such as a circuit or device, the foregoing object cutting method bonds an object to be processed for separation to the rear face (a surface opposite to one formed with the structure or the multilayer body such as a circuit or device) of the object to cut, forms a modified region in the object for separation by laser light but not in the object to cut, and causes a fracture (fissure) generated in the object for separation from the modified region acting as a start point to extend to the object to cut, thereby cutting the same. Therefore, the quality of cut sections of the object is very high (fine), while its resulting chips have a very high bending strength.

The present invention is not limited to the embodiments mentioned above.

For example, the bonding of the object for separation and the object to cut is not limited to anode bonding and surface-activated direct bonding, but may be any of the following bonding methods. Examples of the bonding methods include direct bonding by heating to high temperature and those using liquid crystal waxes, adhesives, solders, and the like. The direct bonding by heating to high temperature is a method in which the bonding surface of the object for separation and the bonding surface of the object to cut are hydrophilized by an acidic chemical, washed with water, dried, and then brought into contact with each other and heat-treated in this state so as to enhance the bonding strength.

The bonding with a liquid crystal wax is a method in which, as disclosed in Japanese Patent Application Laid-Open No. 2005-51055, for example, the liquid crystal wax in a liquid form is interposed by a predetermined thickness between the bonding surface of the object for separation and the bonding surface of the object to cut, and the liquid crystal wax is cooled to solidify in this state. When the object for separation and the object to cut are thus bonded to each other by the liquid crystal wax, the liquid crystal wax may be molten by heating as disclosed in Japanese Patent Application Laid-Open No. 2008-153337, for example, whereby the cut pieces of the object for separation can be removed from the object to cut.

Not only the glass layer 6, but also liquid crystal waxes, adhesives, solders, and any of layers such as oxide films of the silicon substrate may exist between the silicon substrate in the object for separation and the object to cut.

The cut pieces of the object for separation may be removed from the cut pieces of the object not only by etching, but also by polishing the cut pieces of the object for separation or the like. Upon removal by etching, the cut pieces of the object for separation can efficiently be removed from the cut pieces of the object if the part to be etched away (the glass layer 6 and the remaining part 16 of the silicon substrate 12) are patterned such as to include at least the lines to cut 5. If the object for separation is formed with the molten processed region for separation 18, the part of the object for separation formed with the molten processed region for separation 18 can be etched away relatively rapidly (selectively). Typically, an HF solution is used for etching glass, while a KOH solution is used for etching silicon.

The object to cut is not limited to those comprising glass, LTCC, and silicon substrates; the present invention is also applicable to SiC substrates, substrates made of piezoelectric materials such as $LiTaO_3$, and ceramic substrates which are hard to cut.

While it does not matter which of the object for separation (silicon substrate) or the object to cut is larger than the other in size (area), they are bonded to each other such that at least the outermost periphery (outer edge) of the object for separation is located on the outer side of the outermost line to cut (located closest to the outer edge) in the object (the size of the object to cut is greater than the size of the object for separation simply in terms of comparison of their sizes in this case).

Preferably, the size (area) of the object for separation (silicon substrate) is made larger than the size (area) of the object to cut. The force is easier to apply along the lines to cut even in a part closer to the outer edge as the size of the object for separation is greater, since it is applied to the object for separation through a holding member such as an expandable tape attached thereto, so that a fracture is formed and extended for all the lines to cut in the object to cut, thus cutting the same. This is effective in particular when cutting the object by utilizing the expansion of the holding member. The object for separation being greater than the object to cut is also effective in protecting the rear faces of all the chips of the object to cut by the object for separation when peeling (separating) the object for separation from the object to cut.

As the vicinity of the interface between the object for separation and the object to cut is irradiated with the laser light or as the modified region is formed in the object for separation, minute modified regions may be formed at the interface or in the vicinity of the interface in the object to cut. From the viewpoints of quality, strength, and the like of cut sections, however, it is desirable that no modified regions be formed in the object to cut upon irradiation with the laser light.

Figure 37:
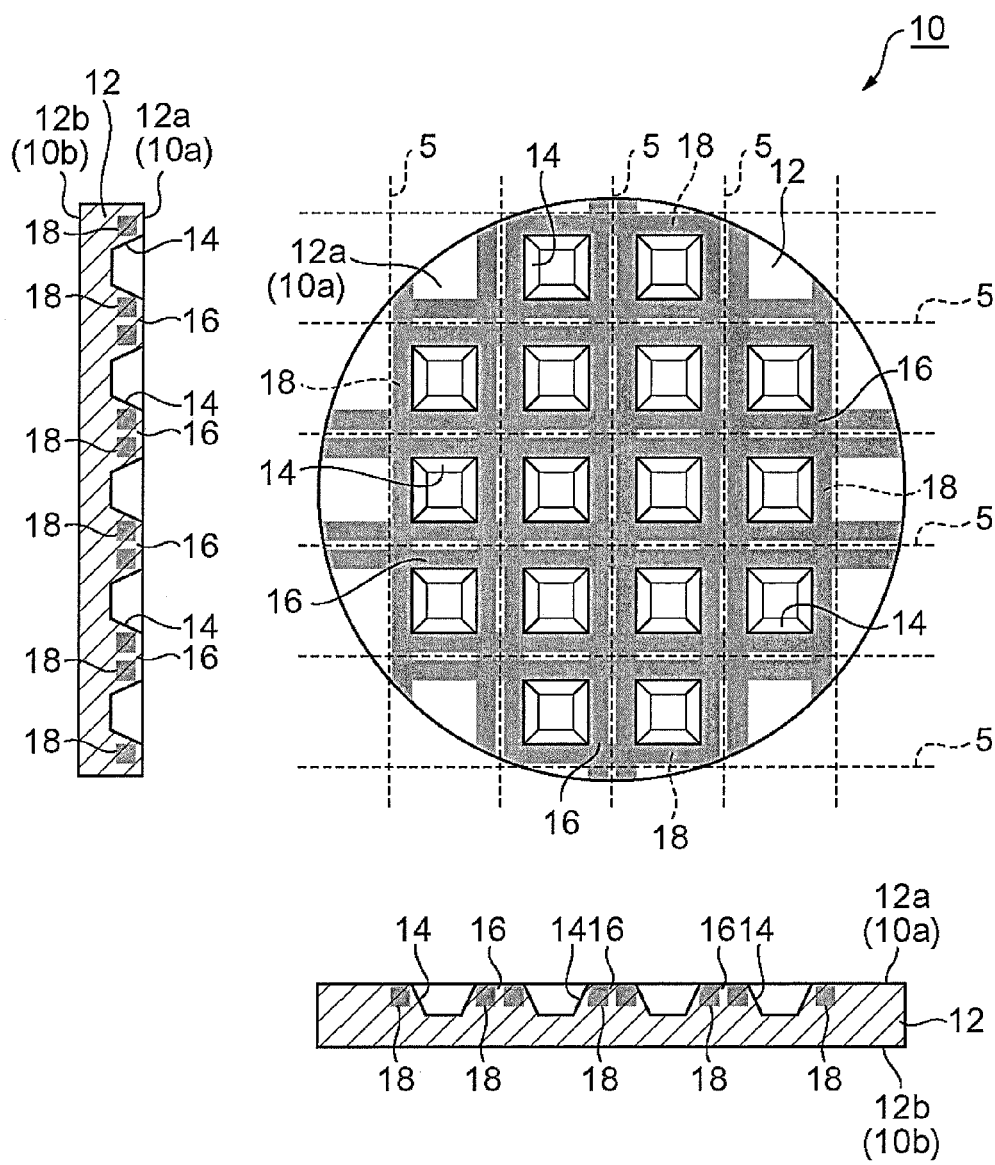
FIG. 37 is a structural view of the object illustrating an example of forming the molten processed region for separation.

When forming the molten processed region for separation 18 in the object for separation 10, it is preferred as illustrated in FIG. 37 that the portion of the remaining part 16 opposing the lines to cut 5 be free of the molten processed region for separation 18. That is, it will be preferred if the molten processed region for separation 18 is formed in the remaining part 16 excluding its portion opposing the lines 5. This can prevent the molten processed region 18 from blocking the laser light L when forming the molten processed region 13 to become a cutting start point in the object for separation 10. This can also prohibit the molten processed region 18 from restraining the progression of the fracture 17 extending from the molten processed region 13.

It is not necessary for the fracture generated from the molten processed region acting as a start point to reach a surface of the object for separation (the second-side end face of the first object) opposite from the object to cut.

INDUSTRIAL APPLICABILITY

The present invention can accurately cut an object to be processed for cutting along a line to cut without being influenced by the material of the object. Since the object is cut by a fissure (fracture) alone without being processed directly, the quality of its cut section is very high (fine), while its resulting chips have a very high bending strength.

REFERENCE SIGNS LIST 1, 1A, 1B, 1C, 1D, 1E, 1F . . . object to be processed (second object to be processed); 2 . . . LTCC substrate; 5 . . . line to cut; 7 . . . modified region; 9 . . . glass substrate; 10A, 10B, 10C, 10D, 10E, 10F . . . object to be processed for separation (first object to be processed); 12 . . . silicon substrate; 13 . . . molten processed region; 15 . . . functional device; 17 . . . fracture; 19, 42A, 42B . . . chip; 21 . . . expandable tape (holding member); L . . . laser light; P . . . converging point

The invention claimed is:

1. An object cutting method comprising the steps of:
   irradiating, in a state where a first-side end face of a sheet-like first object to be processed and a second-side end face of a sheet-like second object to be processed are bonded to each other, the first object with laser light, so as to form a modified region in the first object along a line to cut for cutting the second object into a plurality of chips;
   generating a stress in the first object so as to cause a fracture generated from the modified region acting as a start point to reach a second-side end face of the first object and a first-side end face of the second object and cut the second object along the line; and
   removing cut pieces of the first object from cut pieces of the second object, so as to yield the chips.

2. An object cutting method according to claim 1, wherein the first-side end face of the first object and the second-side end face of the second object are bonded to each other by anode bonding.

3. An object cutting method according to claim 1, wherein the first-side end face of the first object and the second-side end face of the second object are bonded to each other by surface-activated direct bonding.

4. An object cutting method according to claim 1, wherein the first object is irradiated with the laser light while using the second-side end face of the first object as a laser light entrance surface.

5. An object cutting method according to claim 1, wherein the stress is generated in the first object by expanding an expandable holding member attached to the second-side end face of the first object.

6. An object cutting method according to claim 1, wherein the cut pieces of the first object are removed from the cut pieces of the second object by etching.

7. An object cutting method according to claim 6, wherein a modified region for separation is formed in the first object; and
   wherein the etching is performed by using an etchant exhibiting a higher etching rate for the modified region for separation than for an unmodified region in the first object.

8. An object cutting method according to claim 1, wherein the second object has a plurality of functional devices; and
   wherein the line to cut is set such as to pass between the functional devices adjacent to each other.

9. An object cutting method according to claim 1, wherein the second object comprises a glass substrate.

10. An object cutting method according to claim 1, wherein the second object comprises an LTCC substrate.

11. An object cutting method according to claim 1, wherein the second object comprises a sapphire substrate.

* * * * *